United States Patent
Luo

(10) Patent No.: US 7,511,549 B1
(45) Date of Patent: Mar. 31, 2009

(54) COMPACT HIGH-SPEED, HIGH-RESOLUTION COMPARATOR STRUCTURE

(75) Inventor: Qiang Luo, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 44 days.

(21) Appl. No.: 11/712,687

(22) Filed: Feb. 28, 2007

Related U.S. Application Data

(60) Provisional application No. 60/831,901, filed on Jul. 19, 2006.

(51) Int. Cl.
*H03L 5/00* (2006.01)
(52) U.S. Cl. .............................. 327/307; 327/337; 330/9
(58) Field of Classification Search ................. 327/307, 327/337; 330/9
See application file for complete search history.

(56) References Cited

U.S. PATENT DOCUMENTS

| | | | | |
|---|---|---|---|---|
| 4,633,223 A | * | 12/1986 | Senderowicz | 341/118 |
| 5,838,270 A | * | 11/1998 | Kiriaki | 341/143 |
| 5,869,987 A | * | 2/1999 | Tang | 327/77 |
| 6,184,811 B1 | * | 2/2001 | Nagari et al. | 341/143 |

OTHER PUBLICATIONS

Behzad Razavi. *Design Techniques for High-Speed, High-Resolution Comparators.* IEEE Journal of Solid-State Circuits. pp. 1916-1926. vol. 27. No. 12. Dec. 1992.

David Johns and Ken Martin. *Analog Integrated Circuit Design.* pp. 304-333. (John Wiley & Sons 1997).

* cited by examiner

*Primary Examiner*—Kenneth B. Wells

(57) ABSTRACT

Methods and circuits for performing high-speed, high-resolution signal comparisons using offset cancellation, reduction of charge injection noise, and sharing of coupling capacitors between circuit stages. A multistage comparator circuit includes first and second preamplifiers electrically coupled to each other through series connections including coupling capacitors. A latch for storing the comparison output signal is electrically coupled to the output of the second preamplifier. The multistage comparator operates such that the offset voltages of the first preamplifier and of the second preamplifier and latch are stored on the coupling capacitors before performing comparisons.

18 Claims, 19 Drawing Sheets

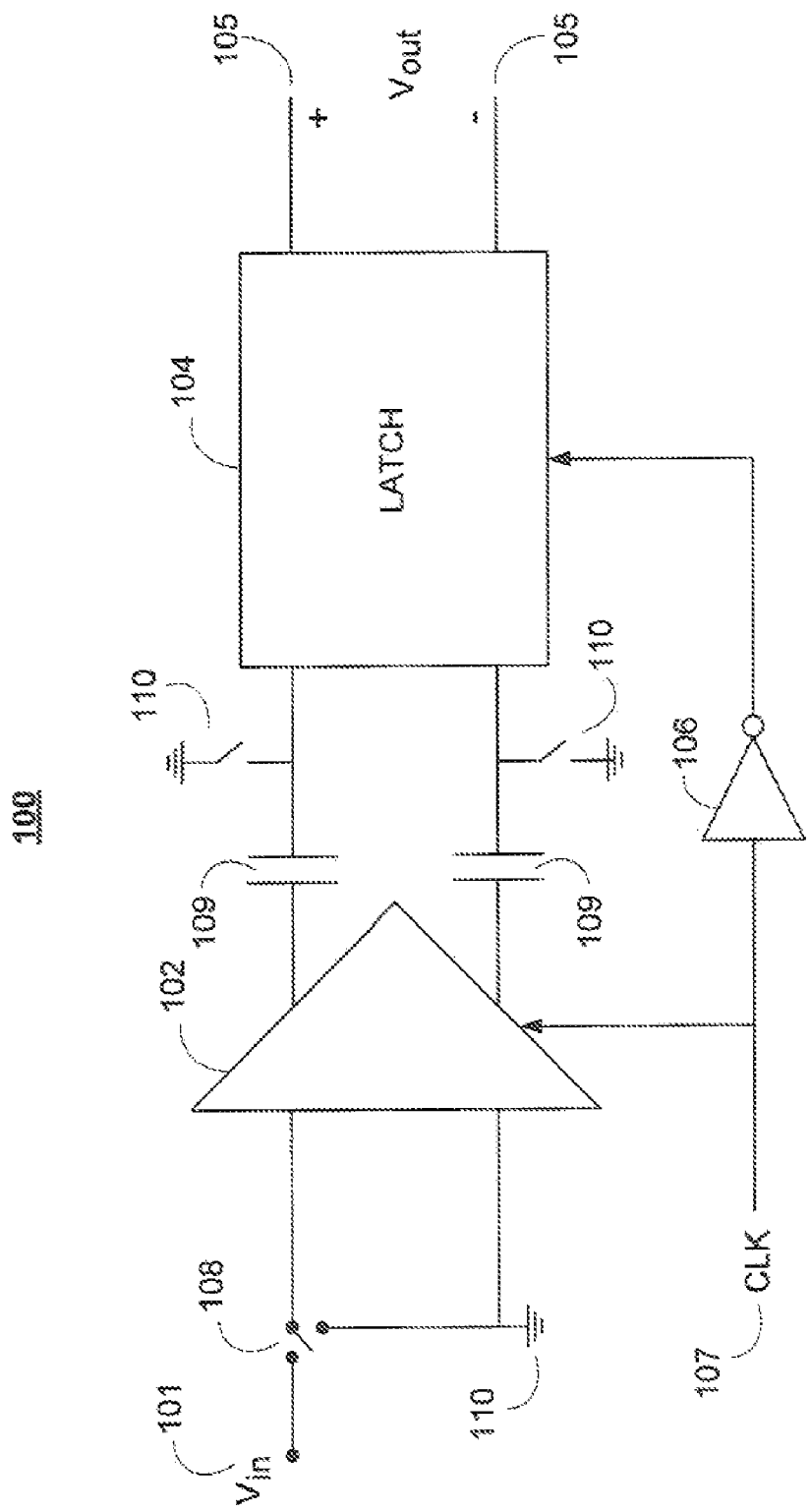
FIG. 1C "Prior Art"

COMPACT HIGH-SPEED, HIGH-RESOLUTION COMPARATOR STRUCTURE

CROSS-REFERENCE TO RELATED APPLICATION

This claims the benefit under 35 U.S.C. § 119(e) of copending, commonly-assigned U.S. Provisional Application No. 60/831,901, filed Jul. 19, 2006, which is hereby incorporated by reference herein in its entirety.

BACKGROUND OF THE INVENTION

This invention relates to methods and circuits for high-speed, high-resolution comparator architectures. More particularly, this invention relates to comparator architectures with latch offset cancellation and coupling capacitor sharing techniques.

Comparator circuits, including amplify-and-latch circuit architectures, are well known. Such circuits can be used to determine the amplitude of signals with respect to common voltage references, or to compare the relative amplitude of two signals. Comparators are especially useful for making digital approximations of analog signals in analog-to-digital converter circuits. When included as part of an analog-to-digital converter design, the speed and resolution of comparators have crucial influences on the overall speed and resolution of the circuit.

A single stage comparator architecture includes a preamplifier stage electrically coupled to a latch. The preamplifier stage samples the voltage difference established at its input, and outputs an amplified difference. The latch serves the dual purpose of digitizing the amplified analog signal at its input to produce a logic level at its output, and sampling the amplified signal to produce a clocked sample of the input signal at its output.

The performance of comparator circuits may be evaluated in terms of bandwidth, power consumption, and resolution. In typical comparator designs, these performance criteria may be traded-off against each other. For example in a single-stage comparator design, the bandwidth of the comparator may be increased at the cost of decreasing the resolution of the comparator or increasing the power consumption of the comparator.

The resolution of a comparator may be limited by the offset voltage of the comparator. The offset voltage may impose an upper limit on the performance of a comparator by preventing the comparator from accurately measuring potential differences smaller than the offset voltage. Switching capacitor circuits may be used to compensate for the offset voltage of the comparator in order to increase the resolution of the comparator. However, the use of switching capacitor circuits may limit the bandwidth of a comparator because of the capacitive loading caused by the switching capacitors. The use of switching capacitor circuits may also produce switching noise including charge injection noise in the circuit, thereby limiting the resolution of the comparator. Switching capacitor circuits may also be expensive to produce because of the additional circuitry they require and the large silicon area required for the fabrication of integrated circuit capacitors.

It would be desirable to have comparator circuit architectures and methods for operating comparator circuits that are able to provide improved performance of comparator circuits. It would therefore also be desirable to provide circuitry for a high-speed, high-resolution comparator that implements latch offset cancellation and a coupling capacitor sharing technique.

SUMMARY OF THE INVENTION

In accordance with the principles of the invention, methods and circuits for performing high-speed, high-resolution signal comparisons are provided. The methods and circuits of the invention provide comparator offset cancellation, reduction of charge injection noise, and sharing of coupling capacitors between circuit stages.

A multistage comparator circuit in accordance with the principles of the invention includes a first preamplifier selectively electrically coupled to the input nodes of the comparator circuit. Each output node of the first preamplifier is electrically coupled to an input node of a second preamplifier through a series connection including a coupling capacitor. The outputs of the second preamplifier are electrically coupled to inputs of a latch circuit. The outputs of the latch circuit are electrically coupled to the output nodes of the comparator circuit and selectively electrically coupled to the input nodes of the second preamplifier. Additional switches are used to selectively couple first and second sources of common-mode voltage to the input nodes of the first and second preamplifiers, respectively. Additional switches may also be used to couple the input nodes of each amplifier together.

A multistage comparator circuit in accordance with the principles of the invention can be operated in three or more phases of operation. During a first phase of operation, the offset voltage of a first preamplifier is stored on coupling capacitors. During a second phase of operation, the offset voltage of a second preamplifier and of a latch circuit is stored on the coupling capacitors. During a third phase of operation, a comparison operation occurs. During the third phase, a comparator input signal can be applied to the input of the first preamplifier and the result of the comparison is stored in the latch circuit. During this phase, the voltages stored on the coupling capacitors can compensate for the offset voltages of the first and second preamplifiers and latch circuit.

The comparator circuits and methods of the invention preferably include switches and methods of operating the switches to reduce charge injection due to the opening and closing of the switches. The comparator circuits and methods can also be used to perform multiple sequential comparisons at high speeds.

The methods and circuits of the invention preferably minimize the effects of comparator offset voltages and charge injection mismatches on the performance of comparator circuits. The methods and circuits preferably increase the resolution of the comparators, and preferably further increase the bandwidth of the comparators by reducing the number of coupling capacitors used by multi-stage comparator circuits.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 1C shows a simplified schematic diagram of a switched capacitor single stage comparator circuit with OOS scheme;

DETAILED DESCRIPTION

The invention will now be described with reference to FIGS. 1-11.

Figure 1A:
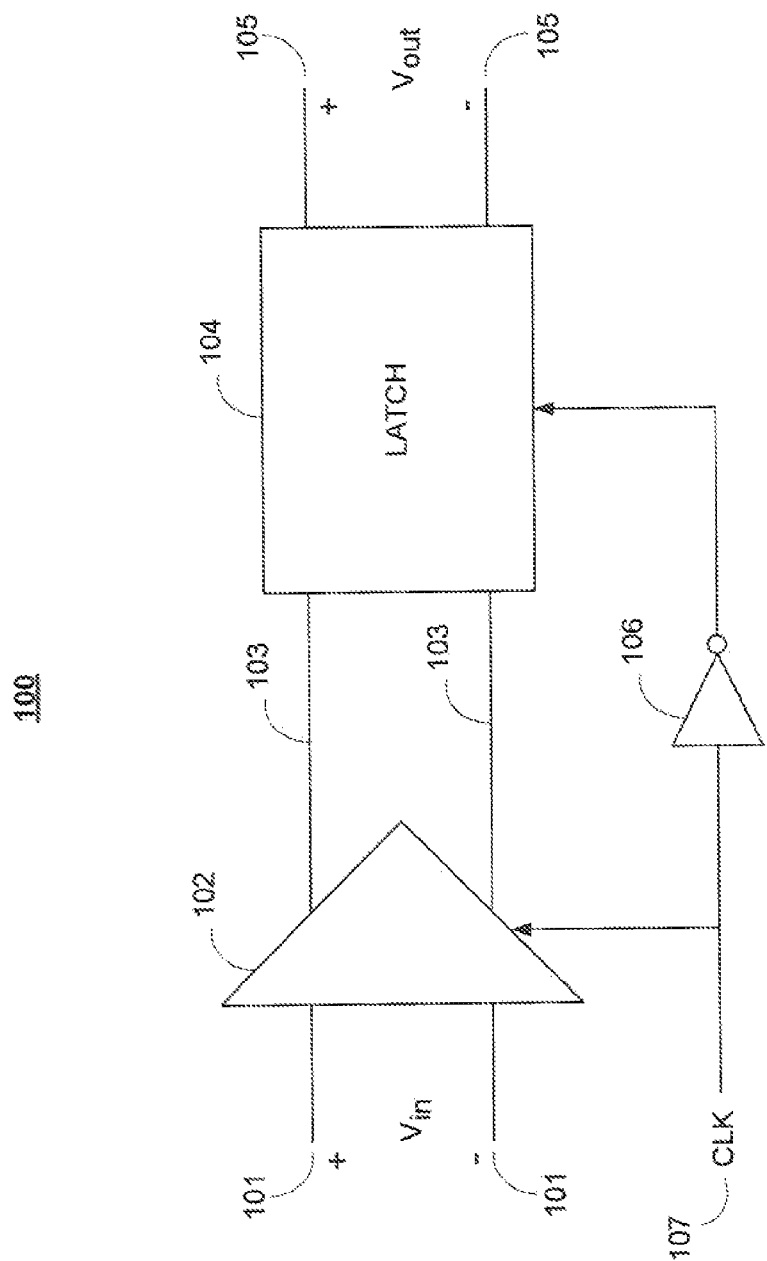
FIG. 1A shows a simplified schematic diagram of a single stage comparator circuit.

FIG. 1A shows a simplified schematic diagram of a single stage comparator circuit 100. Comparator circuit 100 includes preamplifier 102 and latch 104. Comparator circuit 100 receives differential input signal $V_{in}$ at the input nodes 101 of preamplifier 102. The differential output nodes 103 of preamplifier 102 are electrically coupled to the differential input nodes of latch 104. Latch 104 produces the comparator circuit output signal $V_{out}$ at its differential output nodes 105. Preamplifier 102 receives at its enable input node a timing signal CLK. Latch 104 receives at its clock input node an inverted version of timing signal CLK produced by inverter 106.

Timing signal CLK controls the operation of comparator circuit 100. While CLK is high, the comparator circuit prepares an amplified version of its input signal, and passes this result to the latch 104. This is because when CLK is high, the preamplifier 102 is enabled while latch 104 is disabled. Enabled preamplifier 102 produces an amplified version of the input signal $V_{in}$ at its output nodes 103, which are in communication with the input nodes of disabled latch 104. When CLK transitions to a low state, this amplified signal is registered by the latch 104, which in turn produces logic levels at its output. Note that when CLK is low no changes to the input signal are processed as the preamplifier 102 is disabled.

The performance of comparator circuit 100 may be limited by the offset of preamplifier 102 and latch 104. These offsets cause the potential between the input nodes of an amplifier to be different from zero. The offset of the amplifier can be measured at its output as the output-offset voltage of the amplifier. In an ideal amplifier, the offset voltage is equal to zero as the input nodes of an ideal amplifier always have the same potential. However, common amplifier circuits have non-zero offset voltages. Comparator circuit 100 may be incapable of measuring input voltage differences smaller than the input-referred offset voltage.

Figure 1B:
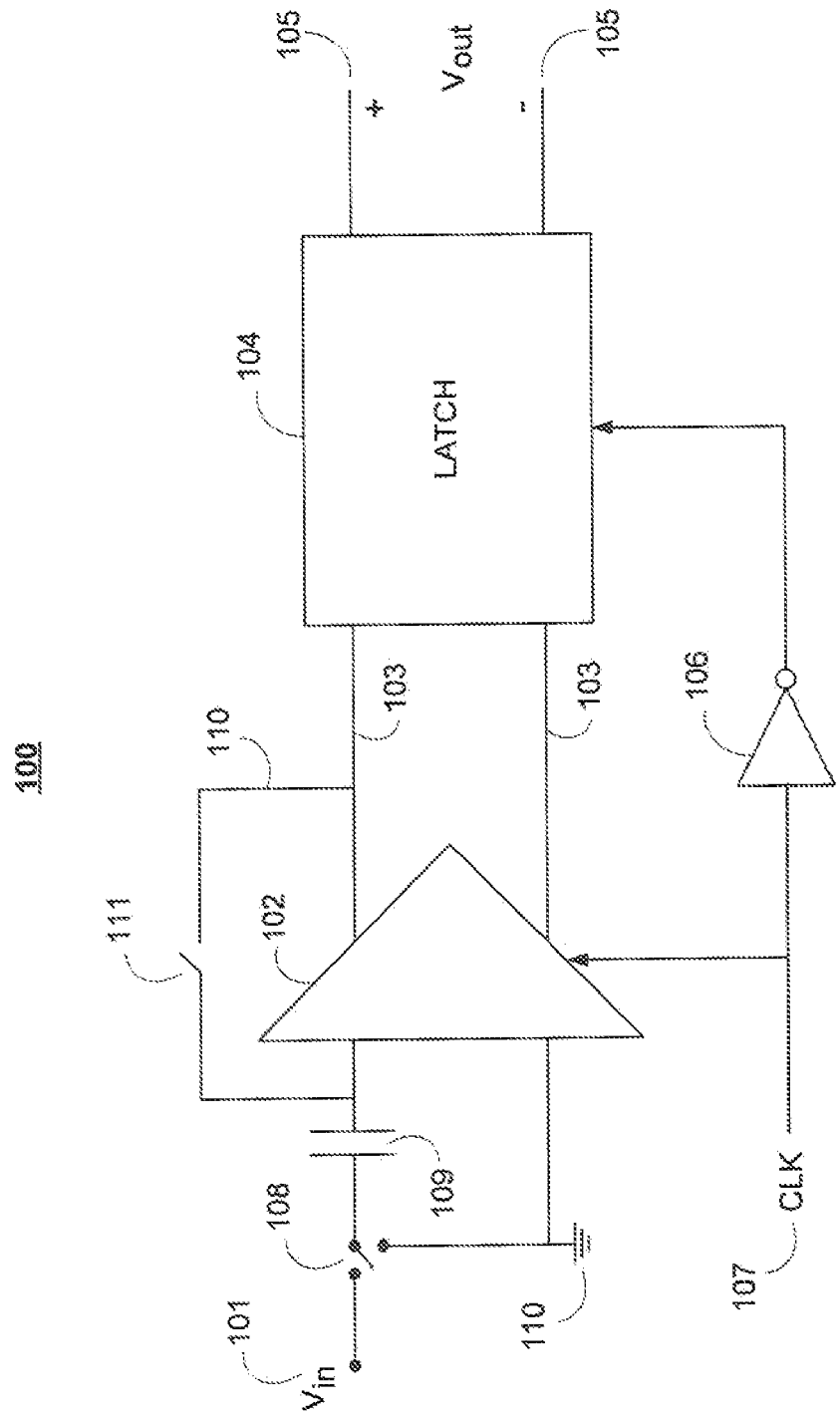
FIG. 1B shows a simplified schematic diagram of a switched capacitor single stage comparator circuit with IOS scheme.

In order to compensate for the input-referred offset voltage of a comparator, switched capacitor circuits may be used as shown in FIG. 1B. FIG. 1B is identical to FIG. 1A, except that it includes switch 108 electrically coupled to input signal 101, capacitor 109, and ground 110. In addition, one of the differential inputs of amplifier 102 is now electrically coupled to ground 110, and there is a feedback loop 110 between node 103 of the output of preamplifier 102 and the right-hand plate of capacitor 109. The feedback loop 110 includes a switch 111 that with a proper clocking signal aids the switched capacitor circuit depicted in FIG. 1B in achieving input offset storage.

Switched capacitor circuits perform input-offset cancellation by measuring the input-offset voltage of the comparator during a first phase of operation, and by subtracting this input-offset voltage from the input signal of the comparator during a second phase of operation. This operation is achieved through the use of switch 108, the switch 111 in the feedback loop 110, and capacitor 109. Comparator circuit 100 performs input-offset cancellation by storing a voltage equal to the input-offset voltage of the comparator on coupling capacitor 109 during a first phase of operation, and by closing feedback loop 110 by closing switch 111 during a second phase of operation. Feedback loop 110 then forces the preamplifier 102 into its active region, and the input-offset voltage is cancelled. This switched capacitor input-offset compensation method may be referred to as input-offset storage ("IOS") compensation.

IOS compensation is used to reduce the input-offset of comparator circuit 100 to a minimum value referred to as the residual input-referred offset and equal to:

$$\frac{V_{OSA}}{1+A} + \frac{\Delta Q}{C} + \frac{V_{OSL}}{A}$$

where $V_{OSA}$ and A are the input-offset and gain of preamplifier 102, respectively, $\Delta Q$ is the mismatch in charge injection from switches electrically coupled to the unity gain loop, $V_{OSL}$ is the latch offset, and C is the capacitance of the switched capacitor. In order to minimize the input-offset of comparator circuit 100, large values of preamplifier gain A and switched-capacitor capacitance C are required. In general, however, large values of capacitance C are undesirable because they increase the capacitive loading of IOS-switched capacitor circuits and limit the bandwidth of the circuits. Large values of capacitance C are also undesirable due to the large amount of layout area they consume. In addition, large values of gain A in single stage comparator architectures commonly lead to long signal propagation delays. For these reasons, IOS compensation may have limited effectiveness in reducing the input-offset of comparators.

In order to compensate for the output-referred offset voltage of a comparator, switched capacitor circuits may be used as shown in FIG. 1C. FIG. 1C is identical to FIG. 1A, except that it includes switch 108 electrically coupled to input signal 101 and ground 110. In addition, each of the differential outputs of amplifier 102 is now electrically coupled to coupling capacitors 109, each of which are coupled to a switch to ground 110. With proper clocking signals the switches 110 aid the switched capacitor circuit depicted in FIG. 1C in achieving an offset compensation method referred to as output offset storage ("OOS") compensation.

During a first phase of OOS compensation, the input nodes of the comparator 100 are electrically coupled to each other and the voltage at the output of amplifier 102 is stored on coupling capacitors 109 that are coupled to the outputs of amplifier 102. The coupling capacitors 109 store a voltage equal to the input-offset voltage $V_{OS}$ of the amplifier multiplied by the gain $A_V$ of the amplifier. During a second phase of operation, the operation of switches 110 allows the voltage stored on the capacitor to be subtracted from the output voltage of the amplifier.

OOS compensation can be used to reduce the offset of comparator circuit 100 to a minimum value referred to as the residual output-referred offset and equal to:

$$\frac{\Delta Q}{A \cdot C} + \frac{V_{OSL}}{A}$$

where A is the gain of preamplifier 102, $\Delta Q$ is the mismatch in charge injection from switches electrically coupled in the unity gain loop, $V_{OSL}$ is the latch offset, and C is the capacitance of the switched capacitor. In order to minimize the offset of comparator circuit 100, large values of preamplifier gain A and switched-capacitor capacitance C are required. However, as discussed previously in the context of IOS, large values of gain A and of switched-capacitor capacitance C are undesirable.

Figure 2:
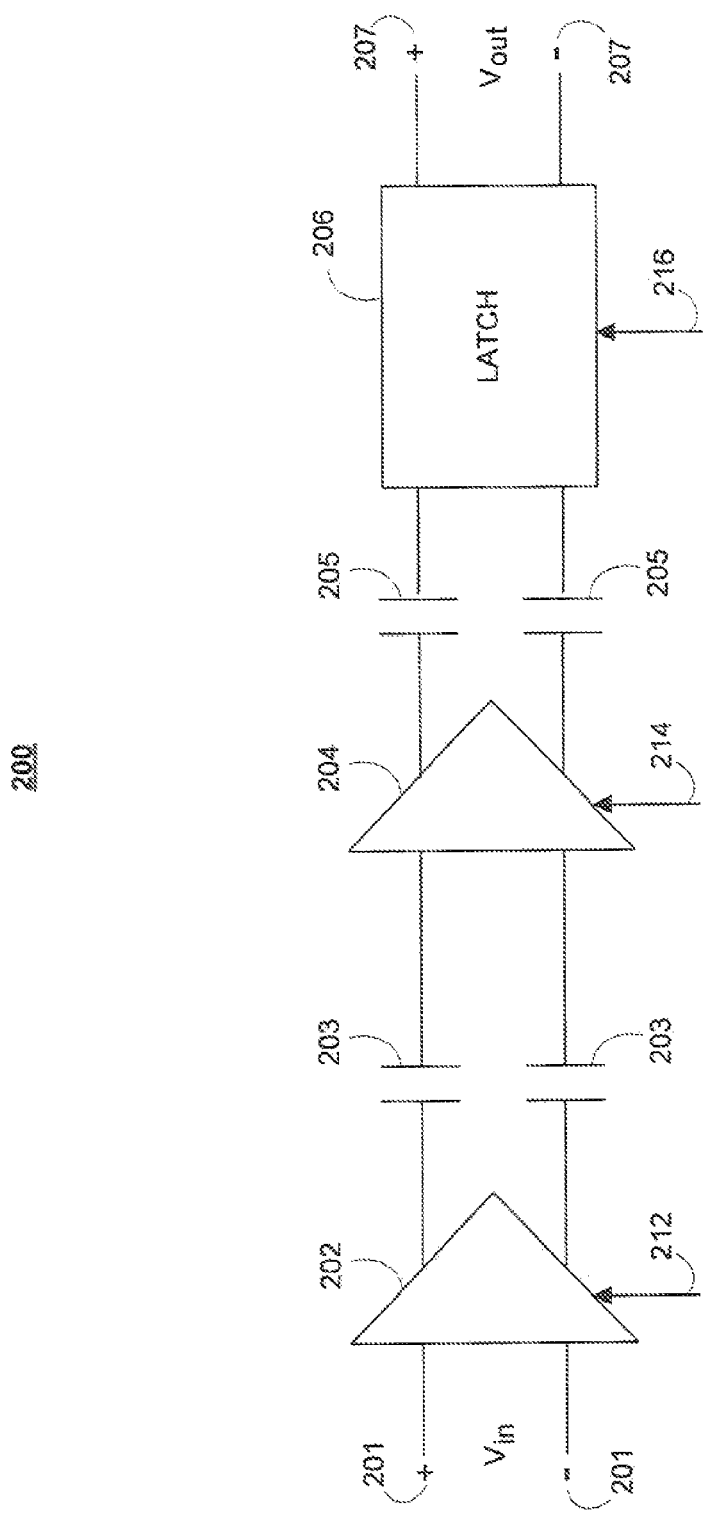
FIG. 2 shows a simplified schematic diagram of a multistage comparator circuit.

FIG. 2 shows a simplified schematic diagram of a multistage comparator circuit 200. Multistage comparator circuit 200, as shown, includes two preamplifier stages 202 and 204 and one latch 206. Additional preamplifier stages may be used in some embodiments of multistage comparator circuit 200. Multistage comparator circuit 200 receives differential input signal $V_{in}$ at the input nodes 201 of preamplifier stage 202. Each differential output node of preamplifier stage 202 is electrically coupled to a differential input node of preamplifier stage 204 through a coupling capacitor 203. Similarly, each differential output node of preamplifier stage 204 is electrically coupled to a differential input node of latch 206 through a coupling capacitor 205. Latch 206 is operative to produce the multistage comparator circuit output signal $V_{out}$ at differential output nodes 207. Each preamplifier stage 202 and 204 receives at an enable input 212, 214 a timing signal operative to enable or disable the operation of the preamplifier. Latch 206 receives at a clock input 216 a timing signal operative to control the operation of multistage comparator circuit 200.

Multistage comparator circuit 200 may provide improved offset cancellation as compared to comparator circuit 100. Multistage comparator circuit 200 provides improved offset cancellation when appropriate switching circuitry and timing and control signals are provided. The circuitry, timing, and control signals allow multistage comparator circuit 200 to sequentially cancel the offset of preamplifier stages 202 and 204 in manners similar to those previously described in relation to IOS and OOS compensation. Multistage comparator circuit 200 may provide improved IOS and OOS compensation as compared to comparator circuit 100 because the multistage comparator circuit has multiple preamplifier stages 202, 204 and therefore has a higher value of gain A than comparator circuit 100.

The performance of multistage comparator circuit 200 may nonetheless be limited by a trade-off between gain, bandwidth, and power consumption. In some embodiments, the gain of multistage comparator circuit 200 can be increased in order to improve the resolution of the comparator to the detriment of the bandwidth and power consumption of the comparator.

The performance of multistage comparator circuit 200 may also be limited by charge injection mismatches. Multistage comparator circuit 200 requires numerous switches to selectively couple and uncouple the switched capacitors 203 and 204 from various circuit nodes. Because of the large number of switches in multistage comparator circuit 200, errors caused by charge injection mismatches between the switches are likely.

Finally, in integrated circuit implementations of multistage comparator circuit 200, a large circuit area may be required to fabricate the many switches and capacitors of multistage comparator circuit 200. Multistage comparator circuit 200 can therefore be expensive to produce.

Figure 3:
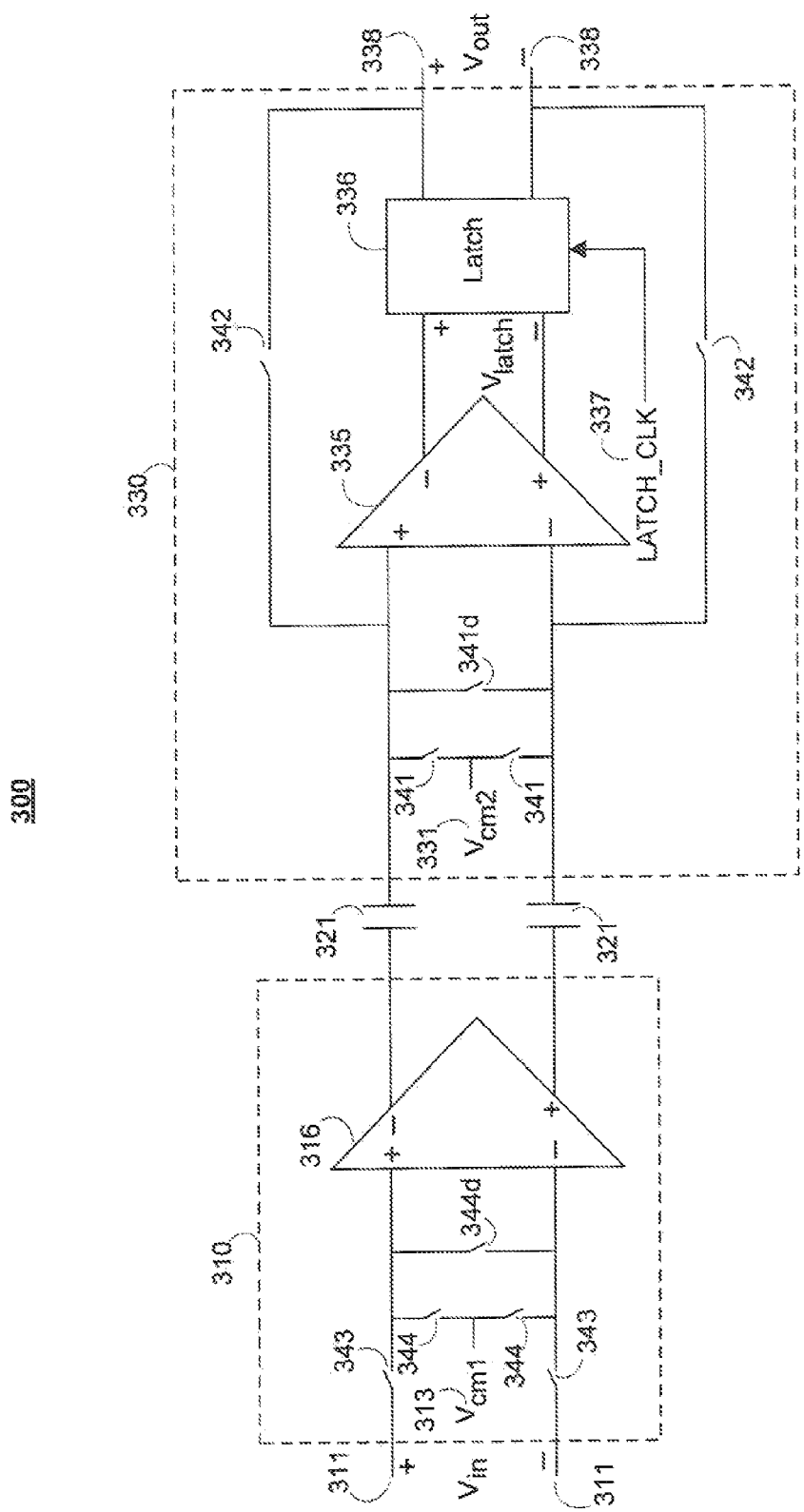
FIG. 3 shows a schematic diagram of a multistage comparator circuit in accordance with the principles of the invention.

FIG. 3 shows a multistage comparator architecture 300 which reduces the performance limitations of multistage comparator 200 described above. Multistage comparator architecture 300 includes first and second preamplifier stages, each preamplifier stage including a preamplifier, a common-mode voltage source, and switches for controlling the operation of the circuit. Multistage comparator architecture 300 additionally includes a latch 336 electrically coupled to the output of the second preamplifier stage. The first stage 310 of multistage comparator architecture 300 receives the comparator input signal $V_{in}$ at the comparator differential input nodes 311. Each comparator input node 311 is electrically coupled to a differential input node of first preamplifier circuit 316 through a switch 343. Two switches 344 are electrically coupled in series between the input nodes of first preamplifier circuit 316. A bias voltage $V_{cm1}$ is preferably provided at the common node 313 shared by switches 344. Switch 344d is preferably electrically coupled to the differential input nodes of first preamplifier circuit 316.

The second stage 330 of multistage comparator architecture 300 includes second preamplifier circuit 335. Second preamplifier circuit 335 has each of its differential input nodes electrically coupled to a different one of the output nodes of first preamplifier circuit 316 through a capacitor 321. The capacitors 321 that are electrically coupled to the differential signal paths preferably have the same capacitance, and are used to couple signals between the stages and to sense and store the signal offsets of both stages. Two switches 341 are electrically coupled to the input nodes of second preamplifier circuit 335. A bias voltage $V_{cm2}$ is preferably provided at the common node 331 shared by switches 341. Switch 341d is preferably electrically coupled to the differential input nodes of second preamplifier circuit 335.

The differential output nodes of second preamplifier circuit 335 are electrically coupled to the input nodes of latch 336. Latch 336 is operative to produce the comparator output signal $V_{out}$ at its differential output nodes 338. Output nodes 338 are preferably electrically coupled through a feedback configuration to the input nodes of preamplifier 335 through switches 342. Latch 336 receives at its clock input a timing signal LATCH_CLK.

The operation of latch 336 is controlled by timing signal LATCH_CLK such that when signal LATCH_CLK transitions from a low state to a high state (rising edge transition), the latch senses the signal $V_{latch}$ at its input nodes. While signal LATCH_CLK is high, latch 336 is operative to maintain the latch output voltage $V_{out}$ to a voltage level corresponding to $V_{latch}$ signal sensed during the previous rising edge in the LATCH_CLK signal. It should be noted that switches 342 are in a feedback configuration and electrically couple the comparator output nodes 338 to the second preamplifier circuit 335 input nodes.

Bias voltages $V_{cm1}$ and $V_{cm2}$ are preferably selected so as to allow first and preamplifier circuits 316 and 335, respectively, to work in the active range of the preamplifier. In addition, bias voltage $V_{cm2}$ is preferably selected to be equal to the common mode output voltage of second preamplifier circuit 335 in order to optimize the operation of the circuit.

In preferred embodiments of multistage comparator architecture 300, switches 341, 341d, 344 and 344d are selected to have smaller sizes than switches 342 and 343. Switches 342 and 343 preferably are selected to have relatively large sizes in order to ensure that they do not introduce delays in the signal path. However, because switches 341, 341d, 344 and 344d are not located in the signal path, their sizes will have limited influence on signal propagation. Switches 341, 341d, 344 and 344d therefore are preferably selected to have smaller sizes in order to occupy less circuit area.

In preferred embodiments of circuit 300, each input node 311 is electrically coupled to an input node of preamplifier 316 through a series combination of a capacitor and a switch 343. In such embodiments, switches 344 and 344d as shown in FIG. 3 preferably are included. The addition of series capacitors between the comparator input nodes 311 and preamplifier input nodes 316 serves to reduce the amount of charge injection mismatch at the input of the comparator circuit.

Figure 4:
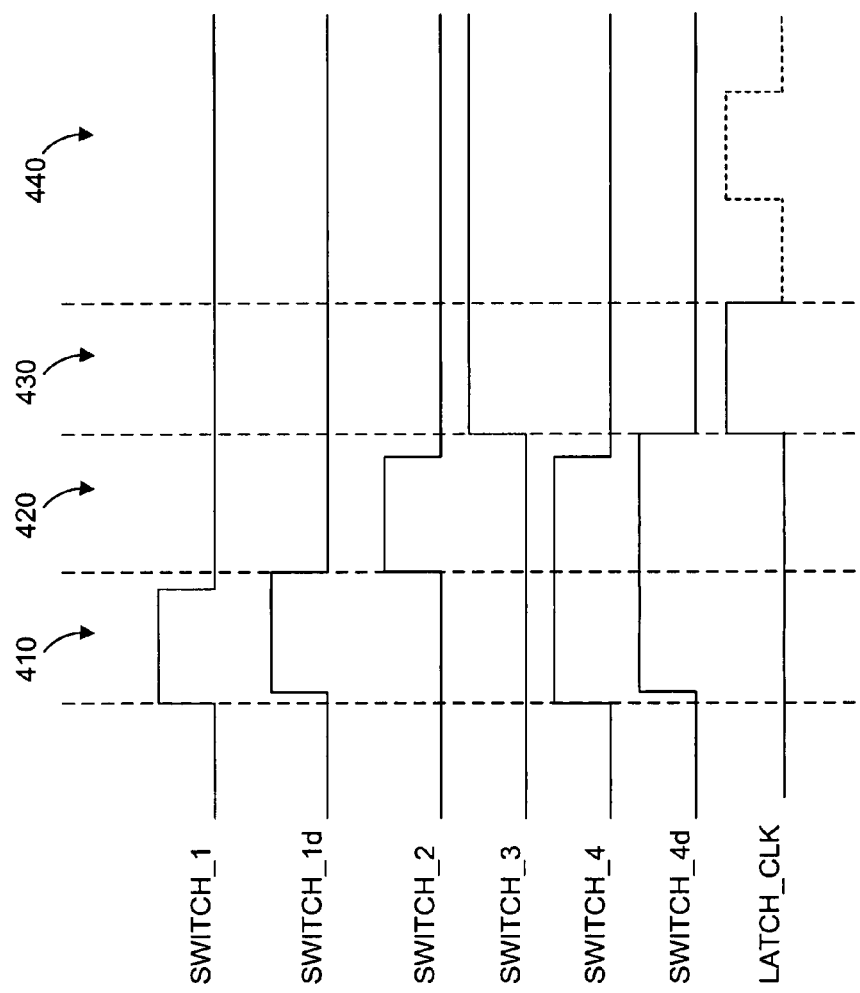
FIG. 4 shows a preferable timing diagram of switch control signals that can be used to control the operation of comparator.

FIG. 4 shows a timing diagram of switch control signals that are preferably used to control the operation of multistage comparator architecture 300. The timing diagram shows three different phases 410, 420 and 430 in the operation of multistage comparator architecture 300, different combinations of switch control signals being enabled in each of the three phases. A fourth phase 440 may also be used to perform additional comparison operations using multistage comparator architecture 300, as described later. Four SWITCH control signals and one latch control LATCH_CLK are used to control the operation of multistage comparator architecture 300. In addition, two delayed control signals SWITCH_1d and SWITCH_4d, which respectively correspond to delayed versions of the SWITCH_1 and SWITCH_4 signals, are used. The delayed control signals are copies of the corresponding non-delayed signals, and are delayed by a few nanoseconds. The SWITCH_1 signal controls the operation of switches 341, SWITCH_1d the operation of switch 341d, SWITCH_2 the operation of switches 342, SWITCH_3 the operation of switches 343, SWITCH_4 the operation of switches 344, and SWITCH_4d the operation of switch 344d. The LATCH_CLK signal controls the operation of latch 336 as described previously in connection with FIG. 3.

Figure 5:
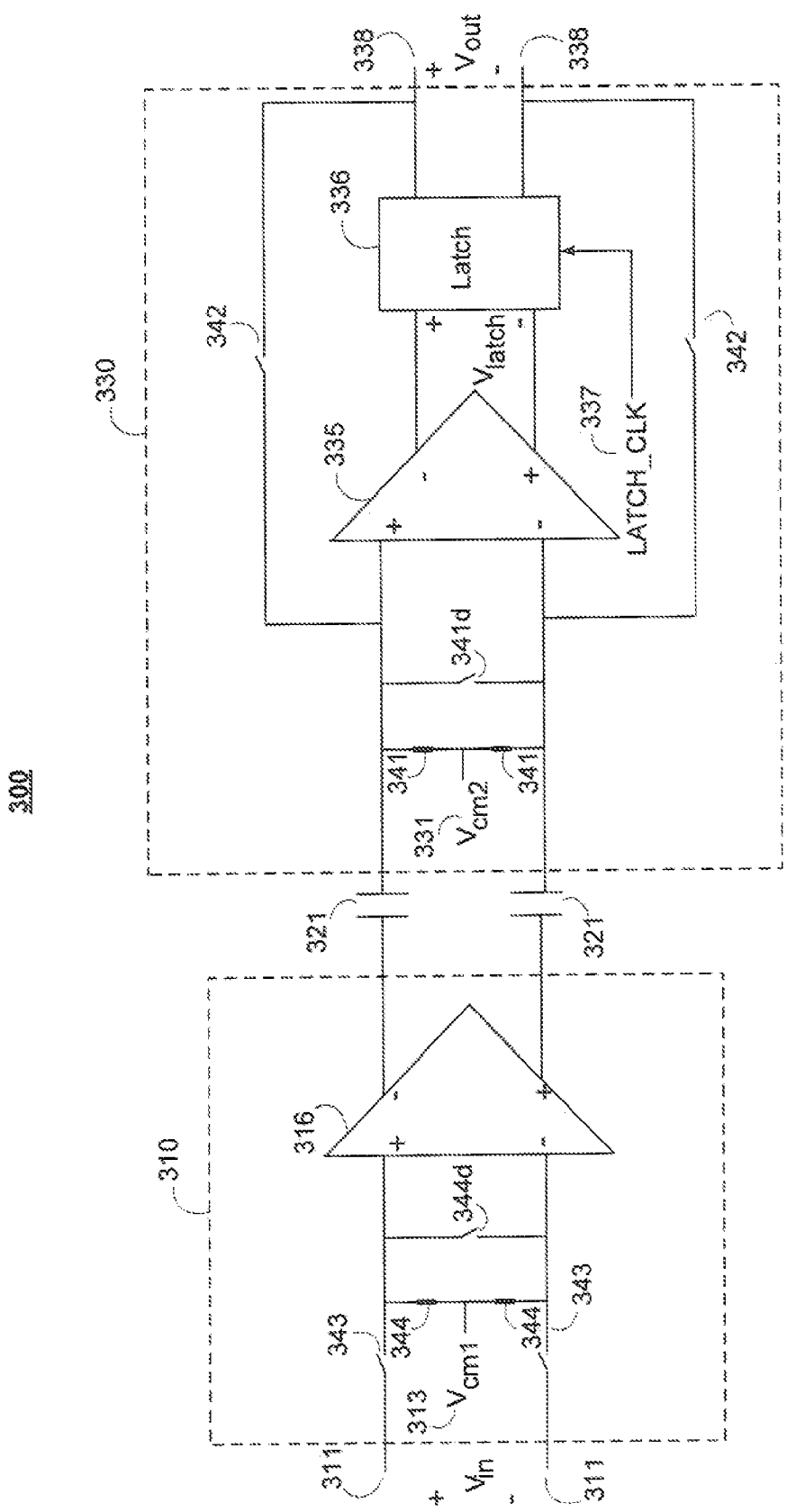
FIG. 5 shows a schematic diagram of the multistage comparator of FIG. 3 during a first phase of operation in accordance with the principles of the invention.
Figure 6:
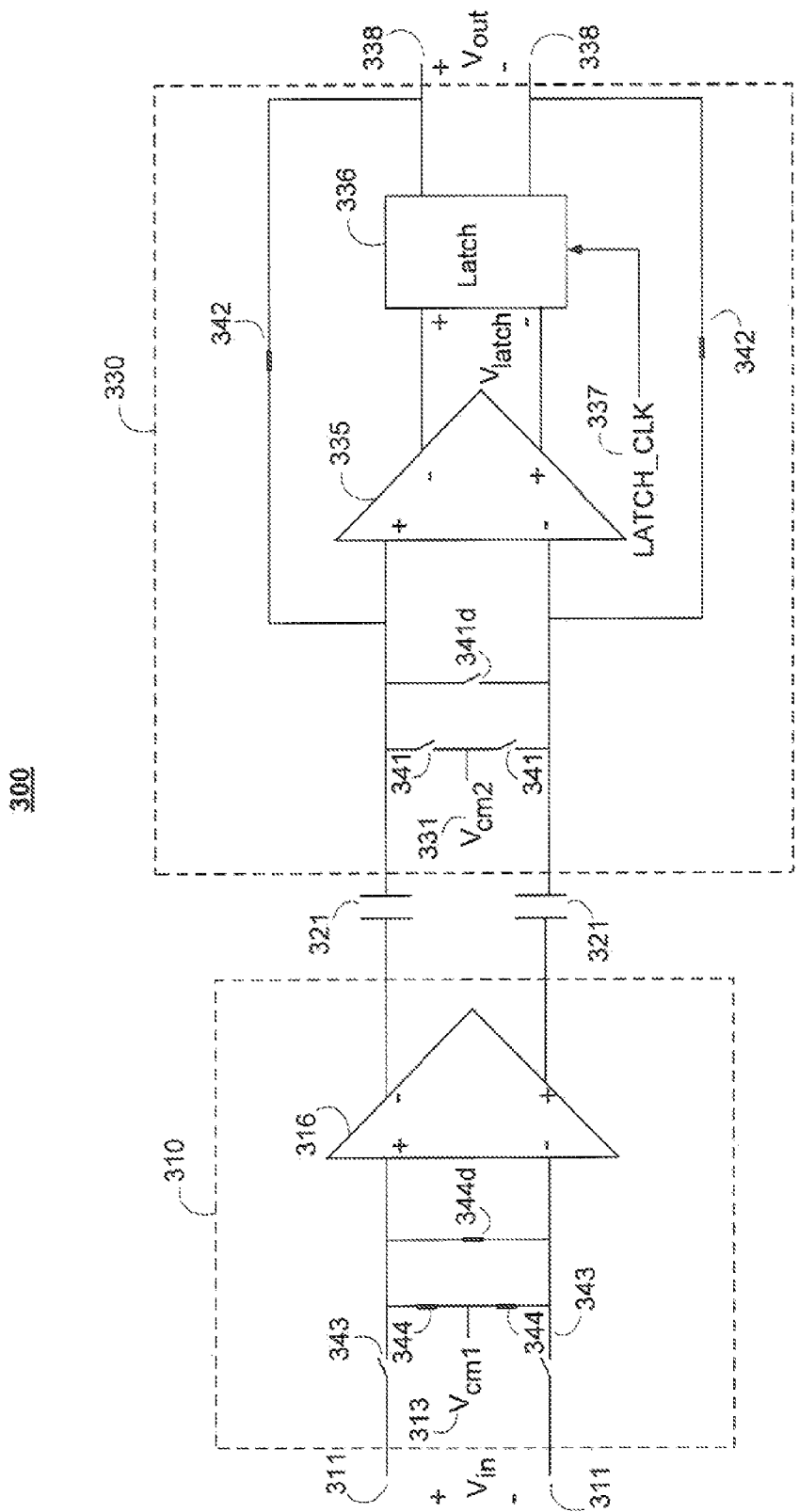
FIG. 6 shows a schematic diagram of the multistage comparator of FIG. 3 during a second phase of operation in accordance with the principles of the invention.
Figure 7:
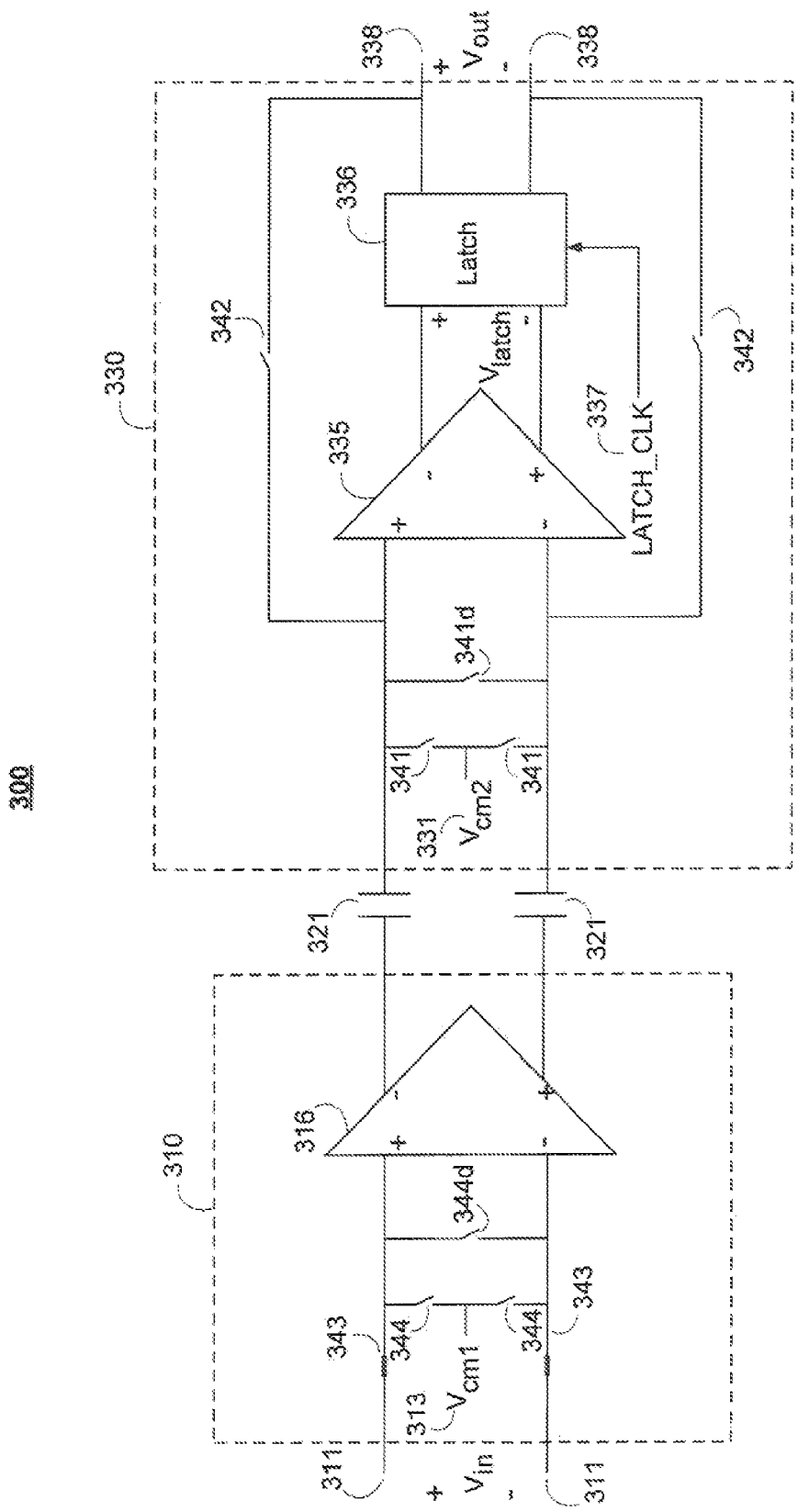
FIG. 7 shows a schematic diagram of the multistage comparator of FIG. 3 during a third phase of operation in accordance with the principles of the invention.

FIGS. 5-7 show schematic diagrams of multistage comparator architecture 300 during each of three phases 410, 420, 430 of operation of the comparator circuit. The schematic diagrams of FIGS. 5-7 show the switches of circuit 300 in the open and closed configurations determined by the corresponding SWITCH control signals shown in the timing diagram of FIG. 4. For example during the first phase of operation 410 shown in FIG. 5, switches 341 are shown as being closed because signal SWITCH_1 is high during phase 410, while switches 342 are shown as being open because signal SWITCH_2 is low during phase 410.

FIG. 5 shows a schematic diagram of multistage comparator architecture 300 at the beginning of the first phase 410 of operation. During phase 410, signals SWITCH_1 and SWITCH_4 are in high states, while signals SWITCH_2 and SWITCH_3 are in low states. Signals SWITCH_1d and SWITCH_4d transition into high states shortly after the beginning of first phase 410. Because signals SWITCH_1 and SWITCH_4 are high, switches 341 and 344 are closed and the inputs of preamplifiers 316 and 335 are electrically coupled to the common-mode voltage sources $V_{cm1}$ and $V_{cm2}$, respectively. In addition, because signals SWITCH_1d and SWITCH_4d transition to high states during first phase 410, switches 341d and 344d are closed shortly after the beginning of first phase 410. The differential input nodes of first and second preamplifier circuits 316 and 335 are thereby shorted together. During phase 410, signals SWITCH_2 and SWITCH_3 are low and switches 342 and 343 are therefore open. The circuitry of multistage comparator architecture 300 is therefore electrically uncoupled from its input and output nodes.

Phase 410 is used to store the output offset voltage of first preamplifier circuit 316 on the left-hand plates of capacitors 321 in a manner reminiscent of OOS compensation. During phase 410, because switches 344 and 344d are closed, the differential input of first preamplifier circuit 316 is zero. The differential output of first preamplifier circuit 316 will therefore be equal to the output offset voltage $V_{os1}$ of first preamplifier circuit 316. Because switches 341 and 341d are closed, the right-hand plates of capacitors 321 are electrically coupled to each other and to the $V_{cm2}$ common-mode voltage source. Because the left-hand plates of capacitors 321 are electrically coupled to the output of first preamplifier circuit 316, the output offset voltage of the preamplifier is stored on capacitors 321 during phase 410. The output offset voltage of preamplifier 316 is equal to $A_{v1} \cdot V_{os1}$ where $A_{v1}$ is the gain of preamplifier 316 and $V_{os1}$ its input-referred offset. At the end of phase 410, signal SWITCH_1 goes low, causing switches 341 to open. Signal SWITCH_1d transitions to a low state shortly after signal SWITCH_1, causing switch 341d to open.

In order to minimize the charge injection introduced by switches 341 and 344, switches 341d and switch 344d are controlled by delayed timing signals SWITCH_1d and SWITCH_4d, respectively. Because switches 341d and 344d remain closed while switches 341 and 344 are opened, any charge injected into the circuit by the opening of switches 341 and 344 is equally distributed between the differential input nodes of each of first and second preamplifier circuits 316 and 335. Any charge injection caused by the opening of switches 341 and 344 therefore does not contribute to voltage offsets at the inputs of the preamplifiers.

Once the output offset voltage $V_{os1}$ of preamplifier 316 is stored on capacitors 321, multistage comparator architecture 300 enters its second phase 420 of operation. FIG. 6 shows a schematic diagram of multistage comparator architecture 300 during second phase 420. During phase 420, the SWITCH_2 signal transitions to a high state, causing switches 342 to close, thereby causing each output node 338 to be electrically coupled to the corresponding input node of preamplifier 335. During phase 420, the SWITCH_1, SWITCH_1d, and SWITCH_3 signals are low, ensuring that switches 341, 341d and 343 are open. During phase 420, the SWITCH_4 and SWITCH_4d signals remain high, causing switches 344 and 344d to couple the input nodes of preamplifier 316 to the common-mode voltage $V_{cm1}$.

Phase 420 is used to store the input-offset voltage of preamplifier 335 on the right-hand plates of capacitors 321 in a manner reminiscent of IOS compensation. In preferable embodiments, phase 420 stores the input-offset voltage of both preamplifier 335 and latch 336 on the right-hand plates of capacitors 321. Because switches 344 and 344d remain closed, the differential input of preamplifier 316 is zero and the differential output of preamplifier 316 remains equal to the amplified output offset voltage $A_{v1} \cdot V_{os1}$ of preamplifier 316. During this phase, the latch control signal LATCH_CLK is low and latch 336 is in a conducting state. Because switches 342 are closed and latch 336 is conducting, preamplifier 335 is electrically coupled in a unity-gain feedback configuration through latch 336 and closed switches 342. The potential at the input nodes of preamplifier 335 is therefore equal to:

$$-\frac{A_{v2}}{1+A_{v2}}V_{os2},$$

where $A_{v2}$ is the gain of preamplifier 335 and $V_{os2}$ is the output offset voltage of preamplifier 335.

In embodiments in which the gain $A_{v2}$ of preamplifier 335 is high, the potential at the input nodes of preamplifier 335 is approximately equal to $-V_{os2}$, corresponding to the output offset voltage of preamplifier 335. Because capacitors 321 are electrically coupled to the input nodes of preamplifier 335, the $-V_{os2}$ potential is stored on the right-hand plates of capacitors 321 during phase 420.

At the end of phase 420, the potential stored on the left-hand plates of capacitors 321 is therefore approximately equal to $A_{v1} \cdot V_{os1}$ and the potential on the right-hand plates of capacitors 321 is approximately equal to $-V_{os2}$.

The performance of multistage comparator architecture 300 may be limited by charge injection mismatches between switches in the circuit. Because of the large number of switches in circuit 300, errors caused by charge injection mismatches have the potential to greatly reduce the resolution and performance of circuit 300. In general, the charge injection residue of switches is influenced by mismatches in the sizes and characteristics of transistors used to implement the switches. The charge injection residue ($\Delta E_2$) of switches 342 significantly limits the resolution of multistage comparator architecture 300 because of the location of these switches in the comparator circuit. The charge injection residue effects ($\Delta E_3$) of switches 344 and 344d comparatively are insignificant. It should be noted, however, that the charge injection residue effects ($\Delta E_3$) of switches 344 and 344d are significant in embodiments in which input capacitors are electrically coupled in series in the signal path at nodes 311.

These charge injection residue effects influence the input-referred offset of the comparator according to the following equation:

$$V_{os} = \frac{V_{os2}}{A_{v1}(1+A_{v2})} + \frac{\Delta E_2}{A_{v1} \cdot C} + \left(\frac{\Delta E_2}{C_{in}}\right)$$

where C is the capacitance of capacitors 321 and $C_{in}$ is the capacitance of input capacitors electrically coupled in series in the signal path at nodes 311. It should be noted that the term involving $C_{in}$ is equal to zero if the input signal $V_{in}$ is directly electrically coupled to the comparator input nodes 311 as shown in FIG. 3.

In an illustrative embodiment of multistage comparator architecture 300 in which $A_{v1}=13$, $A_{v2}=13$, $V_{os2}=25$ mV, $\Delta E_2/C=50\,\mu V$, $\Delta E_3/C_{in}=50\,\mu V$, the input-referred offset is approximately equal to 191.6 μV. This small value of offset makes it possible to achieve 12 or more bits of resolution.

FIG. 7 shows a schematic diagram of multistage comparator architecture 300 during a third phase 430 of operation. During phase 430, signal SWITCH_3 transitions to a high state, causing switches 343 to close and to couple the differential input nodes 311 to the first stage 310 and second stage 330 of the comparator. The SWITCH_1, SWITCH_1d, SWITCH_2, SWITCH_4 and SWITCH_4d signals are low, ensuring that switches 341, 341d, 342, 344, and 344d are open. The latch control signal LATCH_CLK transitions to a high state. During phase 430, multistage comparator architecture 300 thereby functions substantially like multistage comparator circuit 200.

Phase 430 is the phase during which the comparison operation occurs. During phase 430, switches 343 are closed and the differential comparator input signal $V_{in}$ is electrically coupled to the input nodes of preamplifier 316. Preamplifiers 316 and 335 produce a latch input signal indicative of the amplitude of the comparator input signal. Capacitors 321, which store voltages related to the output offset of preamplifier 316 and the input-offset of preamplifier 335 and latch 336, provide OOS and IOS compensation. Latch 336 therefore receives at its differential input a signal that is offset-compensated and equal to the pre-amplified differential input signal $V_{in}$. Latch 336 stores the binary value of the latch input signal when the LATCH_CLK signal transitions to a high state, and outputs the stored value at its output nodes 338.

Fourth phase 440 and/or additional phases of operation may be used in accordance with the principles of the invention. Fourth phase 440 is substantially identical to third phase 430. In particular, during fourth phase 440, circuit timing signals are identical to those of phase 430 and multistage comparator architecture 300 behaves analogously. Phase 440 is used to perform additional comparisons using multistage comparator architecture 300 without repeating first and second phases 410 and 420 of operation. During phase 440, a comparison is performed using the offset compensation potentials stored on capacitors 321 during the first and second phases and used during phase 430. The comparison results in a new binary comparison output $V_{out}$ to be produced at output nodes 338 in response to a rising transition in the LATCH_CLK signal occurring during phase 440. Phase 440 is thus used to perform sequential comparisons, for example for use in successive approximation register analog-to-digital converters.

Figure 8:
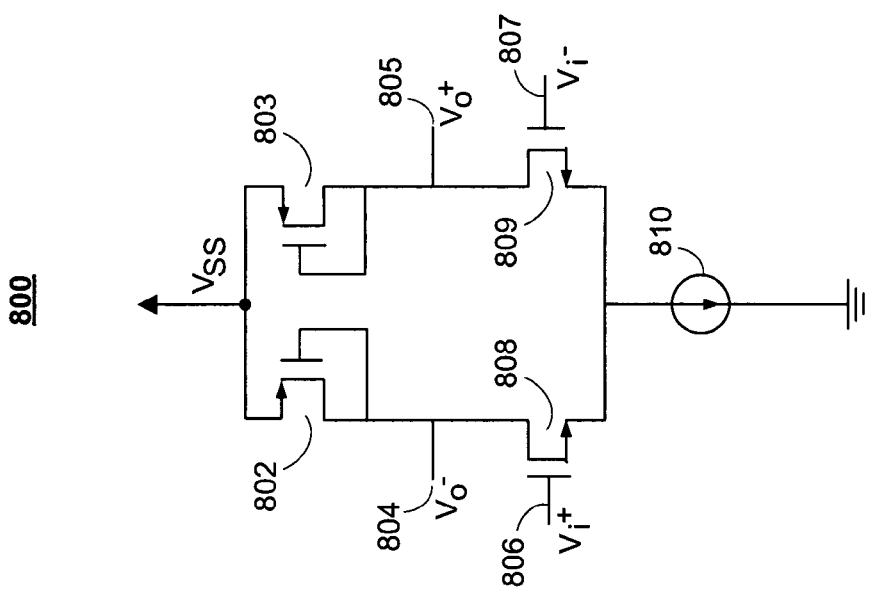
FIG. 8 shows a first illustrative preamplifier circuit in accordance with the principles of the invention.

FIG. 8 shows a first illustrative preamplifier circuit 800 which may be used to implement preamplifiers 316 of FIG. 3, for example. Preamplifier circuit 800 includes two P-type devices 802 and 803, two N-type devices 808 and 809, and a current source 810. Preamplifier circuit 800 receives a differential input signal $V_i$ at the gate nodes 806 and 807 of devices 808 and 809, and produces a differential output signal $V_o$ at the drain nodes of devices 808 and 809. The source nodes of transistors 808 and 809 are electrically coupled to each other and to current source 810. Current source 810 acts as a current sink electrically coupled between the common source node of transistors 808 and 809 and a lower source of voltage such as ground. The drain node 804 of transistor 808 is electrically coupled to output node $V_o^-$ and to the gate and drain nodes of diode-connected transistor 802. Similarly, the drain node 805 of transistor 809 is electrically coupled to output node $V_o^+$ and to the gate and drain nodes of diode-connected transistor 803. The source nodes of transistors 802 and 803 are electrically coupled to each other and to an upper voltage source such as a power supply $V_{SS}$.

Preamplifier circuit 800 may be implemented in CMOS technology. In such embodiments, devices 802 and 803 are PMOS transistors and devices 808 and 809 are NMOS transistors. In some embodiments of preamplifier circuit 800, diode connected devices 802 and 803 are replaced with resistors.

Figure 9:
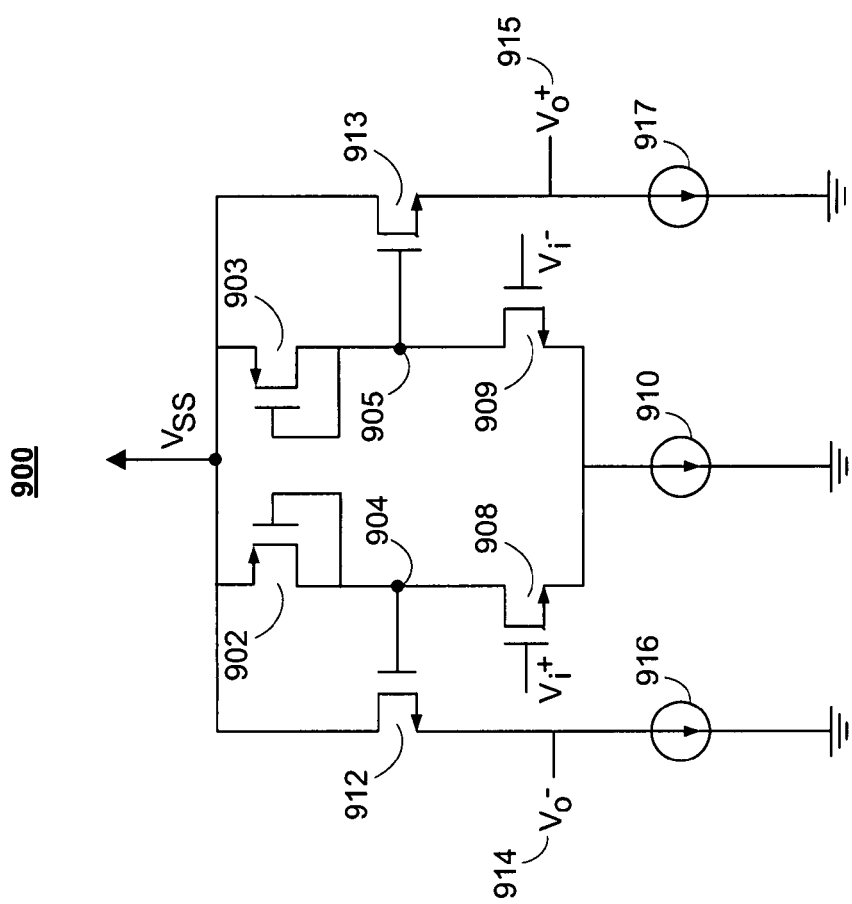
FIG. 9 shows a second illustrative preamplifier circuit in accordance with the principles of the invention.

FIG. 9 shows a second illustrative preamplifier circuit 900 which may be used to implement preamplifiers 316 of FIG. 3. Preamplifier circuit 900 includes circuitry that is substantially similar to the circuitry of FIG. 8. Note that circuitry in circuits 800 and 900 which have substantially similar functionality are numbered similarly. Circuit 900 includes two P-type devices 902 and 903, two N-type devices 908 and 909, and a current source 910 which are electrically coupled in substantially the same configuration as devices 802, 803, 808, 809 and 810 of FIG. 8. Circuit 900 additionally includes two N-type devices 912 and 913 and two current sources 916 and 917. N-type devices 912 and 913 function as source followers with gate nodes respectively electrically coupled to the drain nodes 904 and 905 of N-type devices 908 and 909. The drain nodes of devices 912 and 913 are electrically coupled to each other and to an upper voltage source such as power supply $V_{SS}$. The source nodes 914 and 915 of devices 912 and 913 are respectively electrically coupled to current sources 916 and 917. Current sources 916 and 917 have their second nodes electrically coupled to a lower voltage source or to ground. Preamplifier circuit 900 produces differential output signal $V_o$ between nodes 915 and 914 from differential input signal $V_i$ received at the gate nodes of transistors 908 and 909.

In some embodiments, preamplifier circuit 900 may have a higher slew rate than circuit 800 because of the output current sourcing capabilities provided by devices 912 and 913 and current sources 916 and 917. The increase in slew rate of amplifier 900 may reduce the rise time of signals $V_o$ at the output of the amplifier, especially in situations in which the output nodes of the amplifier are loaded with capacitors. Circuit 900 can advantageously be used to implement preamplifier 316 of FIG. 3 to provide preamplifier 316 with the capability of quickly charging and/or discharging capacitors 321.

Figure 10:
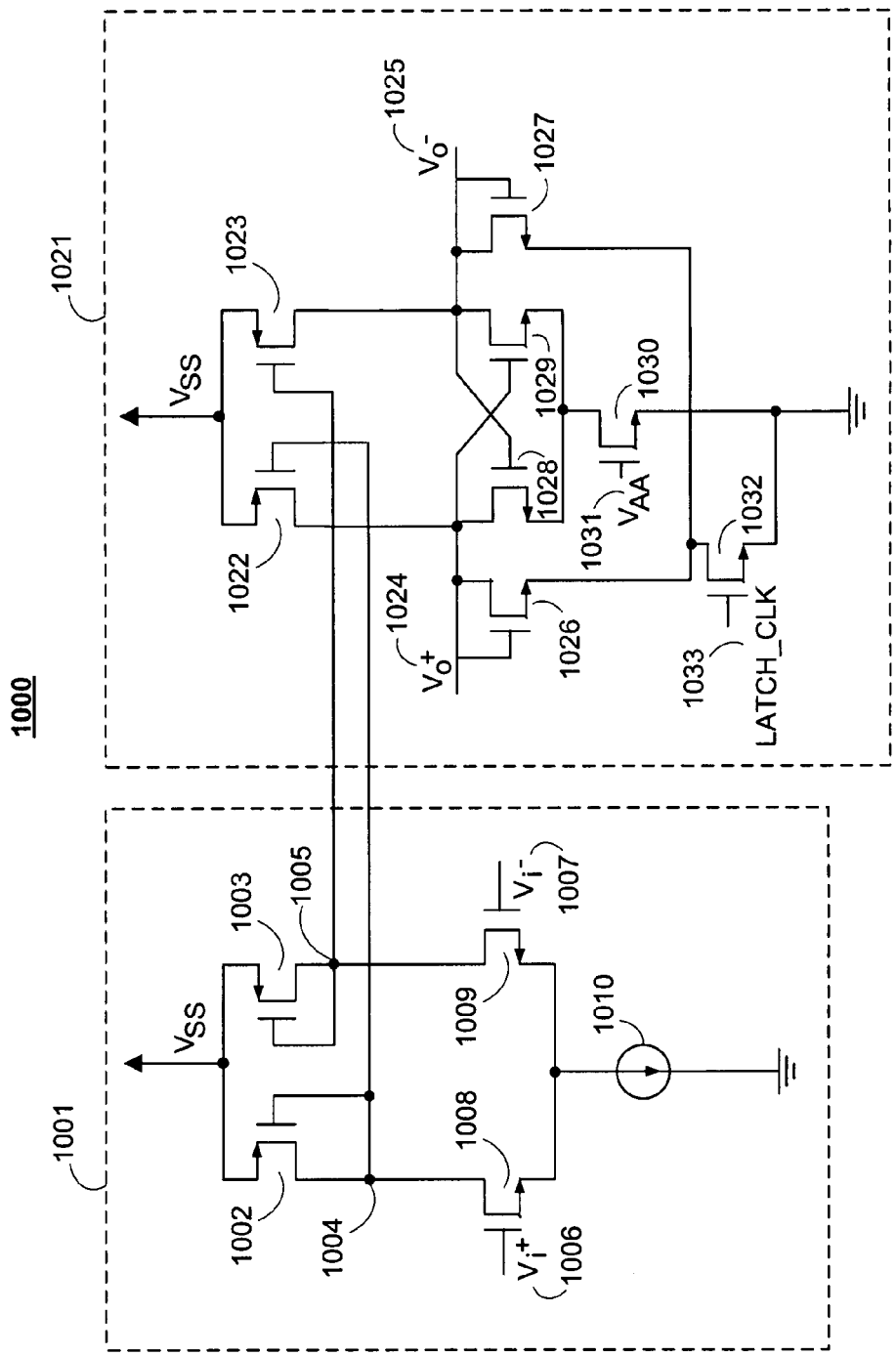
FIG. 10 shows a preferred illustrative circuit that implements the second stage of circuitry of the multistage comparator of FIG. 3 in accordance with the principles of the invention.

FIG. 10 shows illustrative second stage circuitry 1000 implementing second stage 330 of multistage comparator architecture 300. Second stage circuitry 1000 includes preamplifier circuitry 1001 and latch circuitry 1021. Preamplifier circuitry 1001 may implement preamplifier circuit 335 of FIG. 3, for example, and latch circuitry 1021 may implement latch circuit 336 of FIG. 3.

Preamplifier circuit 1001 is substantially similar to preamplifier circuit 800 of FIG. 8. Preamplifier circuit 1001 includes devices 1002, 1003, 1008, and 1009, and current source 1010, which are electrically coupled to each other and function substantially analogously to devices 802, 803, 808 and 809 and current source 810 of preamplifier circuit 800. Preamplifier circuit 1001 receives differential input signal $V_i$ at the gate nodes 1006 and 1007 of devices 1008 and 1009. Preamplifier circuit 1001 produces a differential output signal between the drain nodes 1004 and 1005 of devices 1008 and 1009.

Latch circuit 1021 includes P-type devices 1022 and 1023 having their gates nodes respectively electrically coupled to nodes 1004 and 1005. The source nodes of devices 1022 and 1023 are electrically coupled together and to upper power supply $V_{SS}$. The drain nodes of devices 1022 and 1023 are electrically coupled to the output nodes 1024 and 1025 of latch circuit 1021. Cross-electrically coupled N-type devices 1028 and 1029 have their drain nodes respectively electrically coupled to nodes 1024 and 1025, and their gate nodes respectively electrically coupled to nodes 1025 and 1024. The source nodes of devices 1028 and 1029 are electrically coupled to each other and to the drain node of N-type device 1030. Device 1030 receives at its gate node 1031 a biasing voltage signal $V_{AA}$ which, in some embodiments, may be equal to latch control signal LATCH_CLK. The source node of device 1030 is electrically coupled to a lower power supply or to ground. Latch circuit 1021 may further include diode connected N-type devices 1026 and 1027 electrically coupled such that the gate and drain nodes of device 1026 are electrically coupled to node 1024 and the gate and drain nodes of device 1027 are electrically coupled to node 1025. The source nodes of devices 1026 and 1027 are electrically coupled to each other and to the drain of N-type device 1032. Device 1032 receives at its gate node 1033 a latch control signal LATCH_CLK. The source node of device 1032 is electrically coupled to a lower power supply or to ground. The differential latch output signal $V_O$ is measured between output nodes 1024 and 1025.

Cross-electrically coupled devices 1028 and 1029 form an inherently unstable circuit which causes the latch output signal $V_O$ to oscillate when the LATCH_CLK signal is low. In order to ensure that the latch output signal $V_O$ remains stable when signal LATCH_CLK is low, devices 1026 and 1027 may be larger than devices 1028 and 1029.

Diode-connected devices 1026 and 1027 and cross-electrically coupled devices 1028 and 1029 have a moderately large impedance and form a load on devices 1022 and 1023. Devices 1022 and 1023 and their impedance load provided by devices 1026-1029 form a gain stage which amplifies the signal received at input nodes 1004 and 1005 of the gain stage and which produces an amplifier output signal at nodes 1024 and 1025. In some embodiments of circuit 1000, preamplifier 1001 is optimized to operate at a very high speed. Optimizing preamplifier 1001 to operate at high speeds requires limiting the gain of preamplifier 1001. In such embodiments, the overall gain of circuit 1000 is increased by increasing the gain of the amplification stage formed by devices 1022 and 1023.

Note that when comparator 1000 enters the second phase 420 of operation, the input-offset of the entire second stage, including the input-offset of preamplifier 335 and the input-offset produced by latch 336, is sensed and stored at the right-hand plates of capacitors 321 as described previously. Therefore, both the amplifier 1010 and the latch 1020 are offset calibrated.

Referring now to FIGS. 11A-11G, various exemplary implementations of the present invention are shown.

Figure 11A:
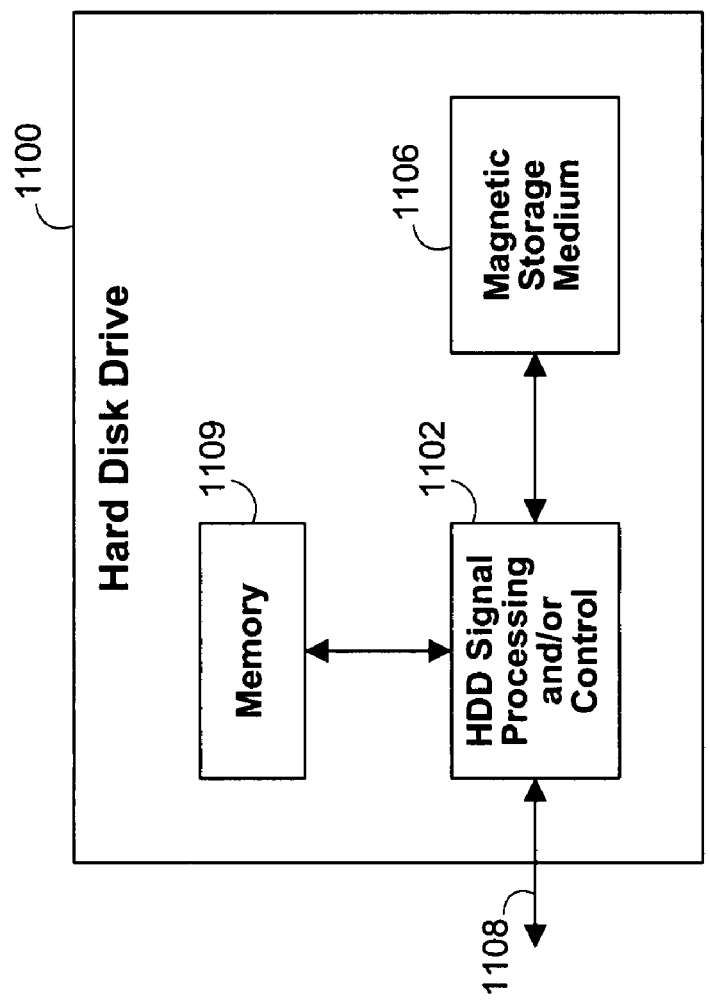
FIG. 11A shows a block diagram of an exemplary hard disk drive that can employ the disclosed technology.

Referring now to FIG. 11A, the present invention can be implemented in a hard disk drive 1100. The present invention may implement either or both signal processing and/or control circuits, which are generally identified in FIG. 11A at 1102. In some implementations, the signal processing and/or control circuit 1102 and/or other circuits (not shown) in the HDD 1100 may process data, perform coding and/or encryption, perform calculations, and/or format data that is output to and/or received from a magnetic storage medium 1106.

The HDD 1100 may communicate with a host device (not shown) such as a computer, mobile computing devices such as personal digital assistants, cellular phones, media or MP3 players and the like, and/or other devices via one or more wired or wireless communication links 1108. The HDD 1100 may be connected to memory 1109 such as random access memory (RAM), low latency nonvolatile memory such as flash memory, read only memory (ROM) and/or other suitable electronic data storage.

Figure 11B:
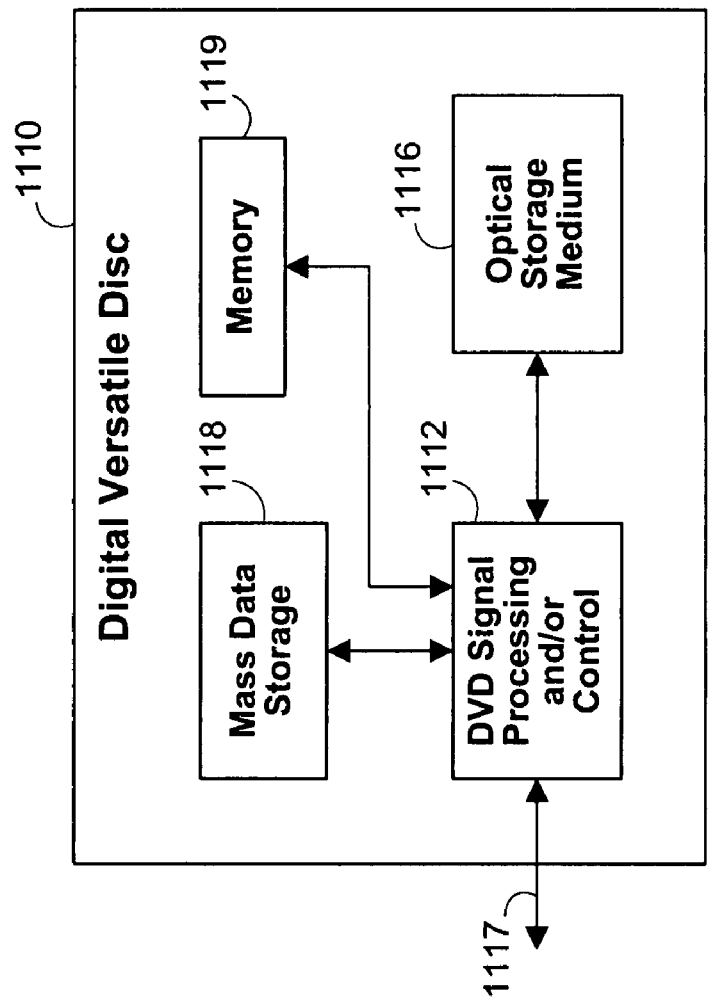
FIG. 11B shows a block diagram of an exemplary digital versatile disc that can employ the disclosed technology.
Figure 11C:
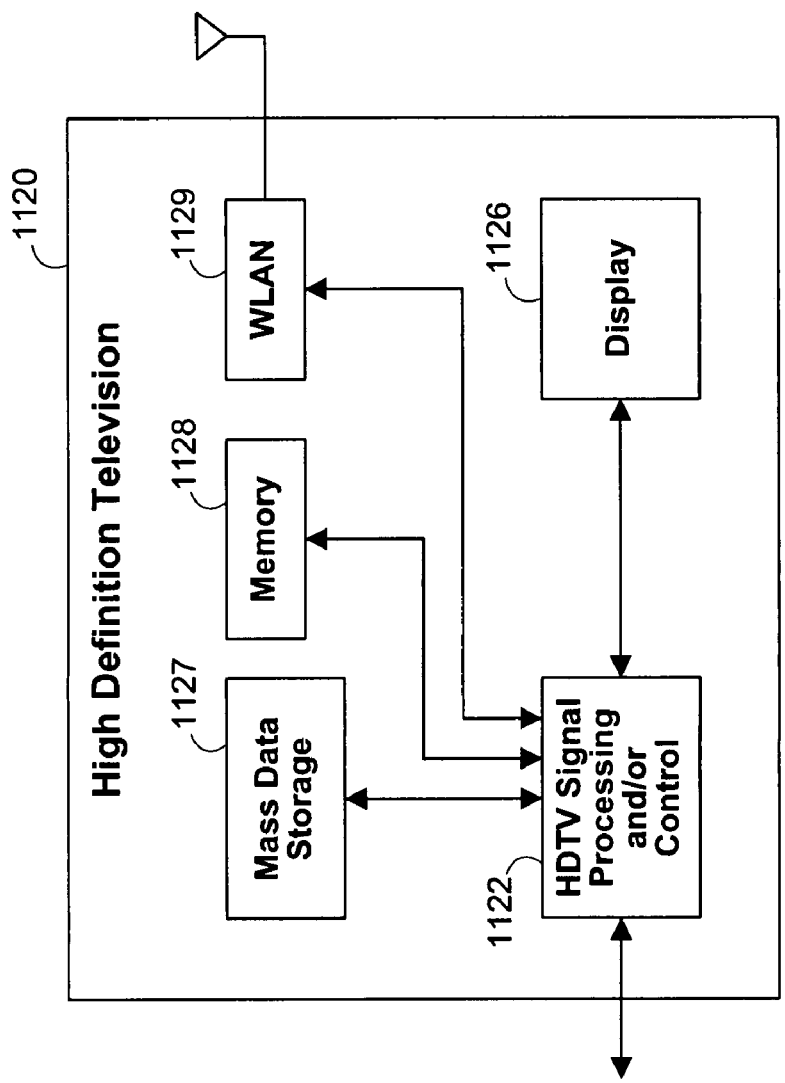
FIG. 11C shows a block diagram of an exemplary high definition television that can employ the disclosed technology.

Referring now to FIG. 11B, the present invention can be implemented in a digital versatile disc (DVD) drive 1110. The present invention may implement either or both signal processing and/or control circuits, which are generally identified in FIG. 11B at 1112, and/or mass data storage of the DVD drive 1110. The signal processing and/or control circuit 1112 and/or other circuits (not shown) in the DVD 1110 may process data, perform coding and/or encryption, perform calculations, and/or format data that is read from and/or data written to an optical storage medium 1116. In some implementations, the signal processing and/or control circuit 1112 and/or other circuits (not shown) in the DVD 1110 can also perform other functions such as encoding and/or decoding and/or any other signal processing functions associated with a DVD drive.

The DVD drive 1110 may communicate with an output device (not shown) such as a computer, television or other device via one or more wired or wireless communication links 1117. The DVD 1110 may communicate with mass data storage 1118 that stores data in a nonvolatile manner. The mass data storage 1118 may include a hard disk drive (HDD). The HDD may have the configuration shown in FIG. 11A. The HDD may be a mini HDD that includes one or more platters having a diameter that is smaller than approximately 1.8". The DVD 1110 may be connected to memory 1119 such as RAM, ROM, low latency nonvolatile memory such as flash memory and/or other suitable electronic data storage.

Referring now to FIG. 11, the present invention can be implemented in a high definition television (HDTV) 1120. The present invention may implement either or both signal processing and/or control circuits, which are generally identified in FIG. 11C at 1122, a WLAN interface and/or mass data storage of the HDTV 1120. The HDTV 1120 receives HDTV input signals in either a wired or wireless format and generates HDTV output signals for a display 1126. In some implementations, signal processing circuit and/or control circuit 1122 and/or other circuits (not shown) of the HDTV 1120 may process data, perform coding and/or encryption, perform calculations, format data and/or perform any other type of HDTV processing that may be required.

The HDTV 1120 may communicate with mass data storage 1127 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 1120 may be connected to memory 1128 such as RAM, ROM, low latency nonvolatile memory such as flash memory and/or other suitable electronic data storage. The HDTV 1120 also may support connections with a WLAN via a WLAN network interface 1129.

Figure 11D:
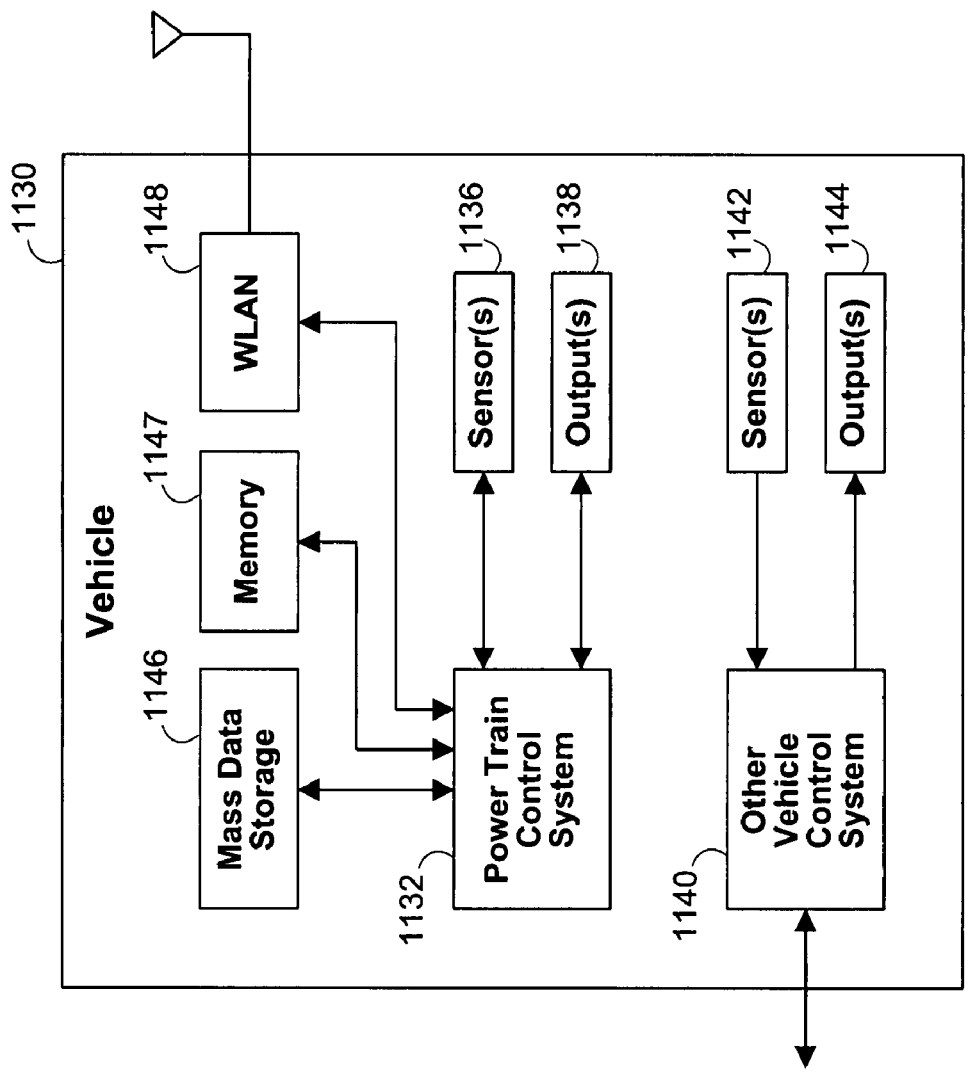
FIG. 11D shows a block diagram of an exemplary vehicle that can employ the disclosed technology.
Figure 11E:
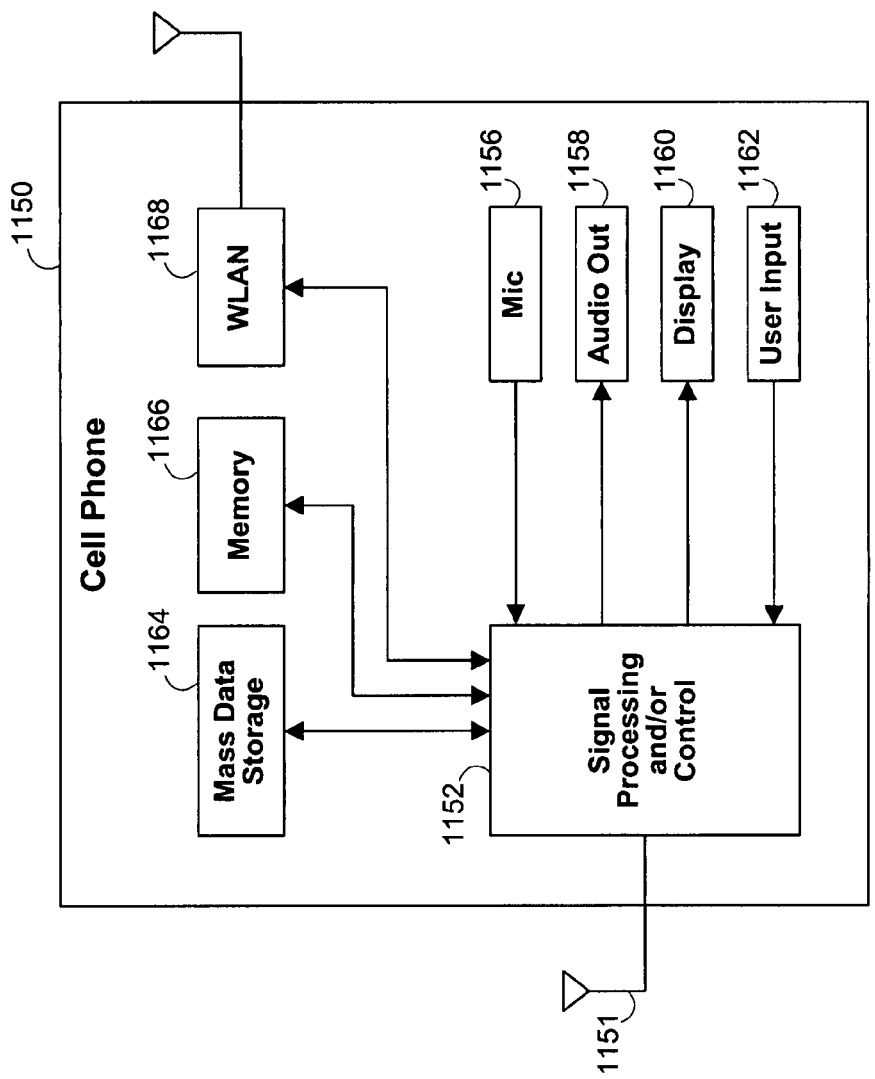
FIG. 11E shows a block diagram of an exemplary cell phone that can employ the disclosed technology.

Referring now to FIG. 11D, the present invention implements a control system of a vehicle 1130, a WLAN interface and/or mass data storage of the vehicle control system. In some implementations, the present invention may implement a powertrain control system 1132 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1140 of the vehicle 1130. The control system 1140 may likewise receive signals from input sensors 1142 and/or output control signals to one or more output devices 1144. In some implementations, the control system 1140 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1132 may communicate with mass data storage 1146 that stores data in a nonvolatile manner. The mass data storage 1146 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 1132 may be connected to memory 1147 such as RAM, ROM, low latency nonvolatile memory such as flash memory and/or other suitable electronic data storage. The powertrain control system 1132 also may support connections with a WLAN via a WLAN network interface 1148. The control system 1140 may also include mass data storage, memory and/or a WLAN interface (all not shown).

Referring now to FIG. 1E, the present invention can be implemented in a cellular phone 1150 that may include a cellular antenna 1151. The present invention may implement either or both signal processing and/or control circuits, which are generally identified in FIG. 11E at 1152, a WLAN interface and/or mass data storage of the cellular phone 1150. In some implementations, the cellular phone 1150 includes a microphone 1156, an audio output 1158 such as a speaker and/or audio output jack, a display 1160 and/or an input device 1162 such as a keypad, pointing device, voice actuation and/or other input device. The signal processing and/or control circuits 1152 and/or other circuits (not shown) in the cellular phone 1150 may process data, perform coding and/or encryption, perform calculations, format data and/or perform other cellular phone functions.

The cellular phone 1150 may communicate with mass data storage 1164 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 1150 may be connected to memory 1166 such as RAM, ROM, low latency nonvolatile memory such as flash memory and/or other suitable electronic data storage. The cellular phone 1150 also may support connections with a WLAN via a WLAN network interface 1168.

Figure 11F:
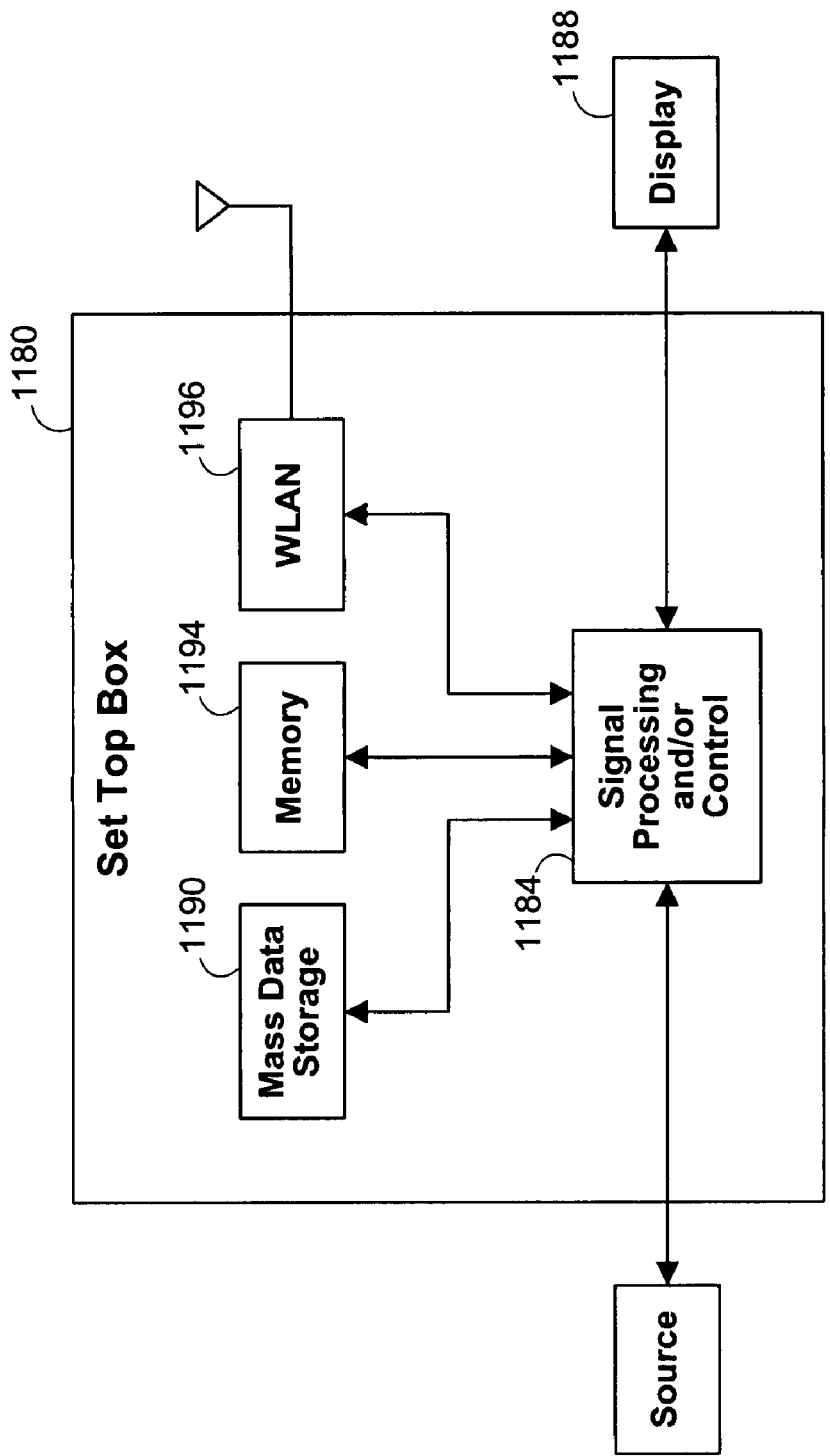
FIG. 11F shows a block diagram of an exemplary set top box that can employ the disclosed technology.

Referring now to FIG. 11F, the present invention can be implemented in a set top box 1180. The present invention may implement either or both signal processing and/or control circuits, which are generally identified in FIG. 11F at 1184, a WLAN interface and/or mass data storage of the set top box 1180. The set top box 1180 receives signals from a source such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

The set top box 1180 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 1180 may be connected to memory 1194 such as RAM, ROM, low latency nonvolatile memory such as flash memory and/or other suitable electronic data storage. The set top box 1180 also may support connections with a WLAN via a WLAN network interface 1196.

Figure 11G:
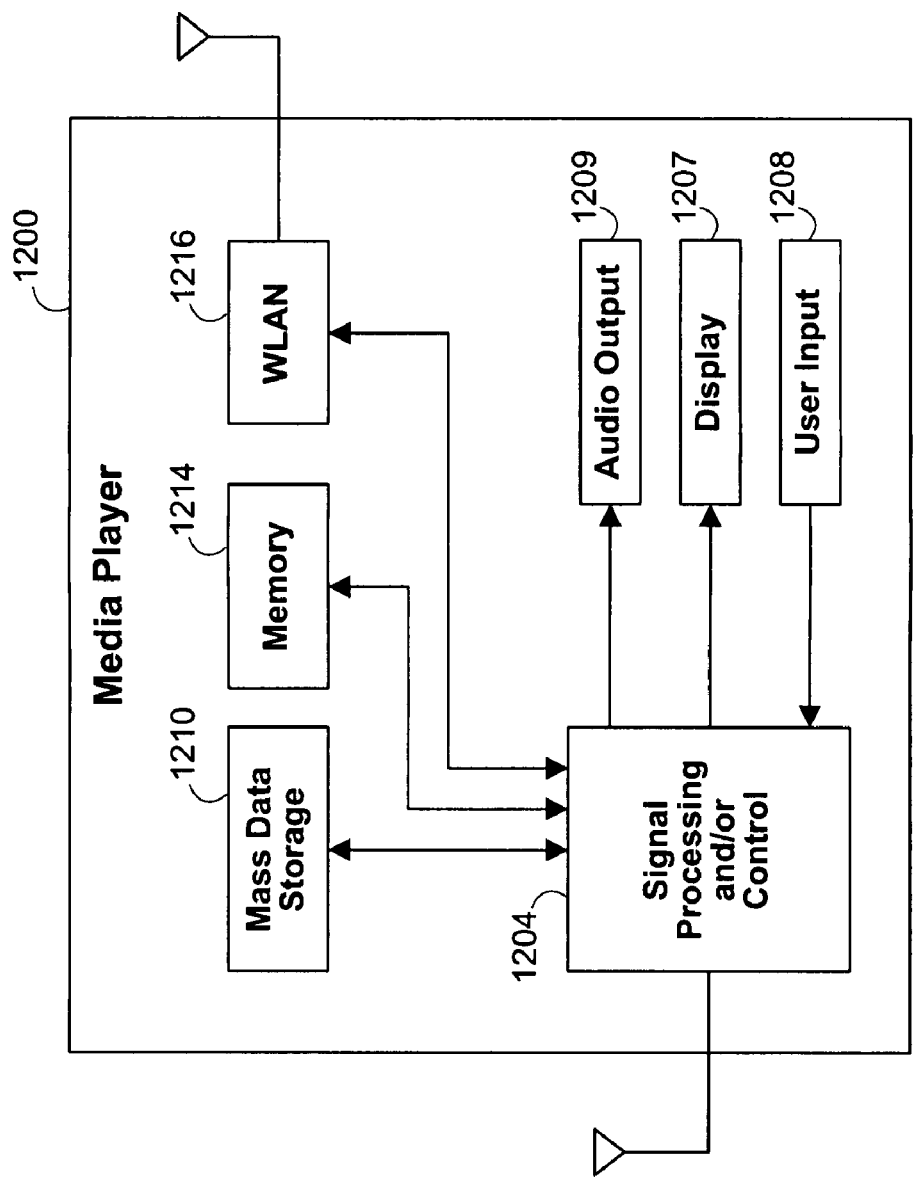
FIG. 11G shows a block diagram of an exemplary media player that can employ the disclosed technology.

Referring now to FIG. 11G, the present invention can be implemented in a media player 1200. The present invention may implement either or both signal processing and/or control circuits, which are generally identified in FIG. 11G at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. The media player 1200 further includes an audio output 1209 such as a speaker and/or audio output jack. The signal processing and/or control circuits 1204 and/or other circuits (not shown) of the media player 1200 may process data, perform coding and/or encryption, perform calculations, format data and/or perform any other media player function.

The media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 1200 may be connected to memory 1214 such as RAM, ROM, low latency nonvolatile memory such as flash memory and/or other suitable electronic data storage. The media player 1200 also may support connections with a WLAN via a WLAN network interface 1216. Still other implementations in addition to those described above are contemplated.

The foregoing describes circuitry and methods for high-speed, high-resolution comparator architectures providing latch offset cancellation and coupling capacitor sharing. One skilled in the art will appreciate that the invention can be practiced by other than the described embodiments, which are presented for purposes of illustration and not of limitation, and the present invention is limited only by the claims that follow.

What is claimed is:

1. A multistage comparator circuit having inputs and outputs, the comparator circuit comprising:
   first pre-amplification circuitry having inputs selectively coupled to the comparator inputs;
   at least one capacitor coupled to an output of the first pre-amplification circuit;
   second pre-amplification circuitry having inputs, wherein each input of the second pre-amplification circuitry is coupled to a respective output of the first pre-amplification circuitry and one input of the second pre-amplification circuitry is coupled to an output of the first pre-amplification circuitry through the capacitor;
   latch circuitry electrically coupled to the outputs of the second pre-amplification circuitry, wherein the outputs of the latch circuit are electrically coupled to the outputs of the comparator; and
   first switching circuitry for selectively coupling an output of the latch circuitry to an input of the second pre-amplification circuitry.

2. The comparator circuit of claim 1, further comprising:
   a first source of common-mode voltage;
   second switching circuitry for selectively coupling the first source of common-mode voltage to all of the inputs of the first pre-amplification circuitry.

3. The comparator circuit of claim 2, further comprising:
   a second source of common-mode voltage;
   third switching circuitry for selectively coupling the second source of common-mode voltage to all of the inputs of the second pre-amplification circuitry.

4. The comparator circuit of claim 3, further comprising:
   fourth switching circuitry for selectively coupling each input of the first pre-amplification circuitry to the inputs of the comparator.

5. The comparator circuit of claim 4, further comprising:
   fifth switching circuitry for selectively electrically coupling the inputs of the first pre-amplification circuitry to each other; and
   sixth switching circuitry for selectively electrically coupling the inputs of the second pre-amplification circuitry to each other.

6. An integrated circuit comprising the comparator circuit of claim 1.

7. A method for operating a comparator circuit, the method comprising:
   charging a capacitor with a first voltage indicative of an offset voltage of a first amplifier;
   charging the capacitor with a second voltage indicative of an offset voltage of a second amplifier;
   performing a comparison operation using the first and second amplifiers, wherein the charge on the capacitor is used to compensate for the offset voltages of the first and second amplifiers;
   coupling a latch to the second amplifier; and
   storing the result of the comparison operation on the latch, wherein the second voltage is indicative of the offset voltage of the second amplifier and the offset voltage of the latch.

8. The method of claim 7, wherein charging the capacitor with a first voltage indicative of an offset voltage of the first amplifier comprises coupling input nodes of the first amplifier to a first source of common-mode voltage and charging the capacitor to a potential equal to the potential at the output of the first amplifier.

9. The method of claim 8, wherein charging the capacitor with a first voltage indicative of an offset voltage of the first amplifier further comprises coupling input nodes of the second amplifier to a second source of common-mode voltage.

10. The method of claim 8, wherein charging the capacitor with a second voltage indicative of an offset voltage of the second amplifier comprises coupling each input node of the second amplifier to an output node of the comparator circuit.

11. The method of claim 10, wherein charging the capacitor with a second voltage indicative of an offset voltage of the second amplifier comprises coupling the input nodes of the first amplifier to the first source of common-mode voltage.

12. A multistage comparator circuit receiving a comparator input signal and a comparator output signal, the circuit comprising:
   means for charging a capacitor with a first voltage indicative of an offset voltage of a first amplifier;
   means for charging the capacitor with a second voltage indicative of an offset voltage of a second amplifier;
   means for performing a comparison operation using the first and second amplifiers, wherein the charge on the capacitor is used to compensate for the offset voltages of the first and second amplifier;
   means for coupling a latch to the second amplifier; and
   means for storing the result of the comparison operation on the latch, wherein the second voltage is indicative of the offset voltage of the second amplifier and the offset voltage of the latch.

13. The comparator circuit of claim 12, wherein the means for charging the capacitor with a first voltage comprises first switching means, the comparator circuit comprising second switching means for reducing charge injection effects caused by the first switching means.

14. The comparator circuit of claim 12, wherein the means for charging the capacitor with a first voltage indicative of an offset voltage of the first amplifier comprises means for coupling input nodes of the first amplifier to a first source of common-mode voltage and means for charging the capacitor to a potential equal to the potential at the output of the first amplifier.

15. The comparator circuit of claim 14, wherein the means for charging the capacitor with a first voltage indicative of an offset voltage of the first amplifier further comprises means for electrically coupling the input nodes of the second amplifier to a second source of common-mode voltage.

16. The comparator circuit of claim 14, wherein the means for charging the capacitor with a second voltage indicative of an offset voltage of the second amplifier comprises means for coupling each input node of the second amplifier to an output node of the comparator circuit.

17. The comparator circuit of claim 16, wherein the means for charging the capacitor with a second voltage indicative of an offset voltage of the second amplifier comprises means for coupling the input nodes of the first amplifier to the first source of common-mode voltage.

18. An integrated circuit comprising the comparator circuit of claim 12.

* * * * *